United States Patent
Dubois et al.

(10) Patent No.: US 10,921,694 B2
(45) Date of Patent: *Feb. 16, 2021

(54) DYNAMIC USER CONTROL SYSTEM

(71) Applicant: Kinestral Technologies, Inc., Hayward, CA (US)

(72) Inventors: Antoine Dubois, Hayward, CA (US); John Bogdan, Hayward, CA (US); Paul Nagel, Hayward, CA (US); Craig Henricksen, Hayward, CA (US); Stephen Coffin, Hayward, CA (US); Wally Barnum, Hayward, CA (US)

(73) Assignee: KINESTRAL TECHNOLOGIES, INC, Hayward, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/748,612

(22) Filed: Jan. 21, 2020

(65) Prior Publication Data

US 2020/0159096 A1    May 21, 2020

Related U.S. Application Data

(63) Continuation of application No. 15/691,297, filed on Aug. 30, 2017, now Pat. No. 10,539,860.

(Continued)

(51) Int. Cl.
| | |
|---|---|
| *G03B 21/14* | (2006.01) |
| *H04N 9/31* | (2006.01) |
| *G06F 3/01* | (2006.01) |
| *G06F 3/0354* | (2013.01) |
| *G06F 3/0362* | (2013.01) |

(Continued)

(52) U.S. Cl.
CPC ........... *G03B 21/145* (2013.01); *G03B 21/10* (2013.01); *G03B 21/28* (2013.01); *G06F 3/016* (2013.01); *G06F 3/0362* (2013.01); *G06F 3/03547* (2013.01); *G06F 3/0488* (2013.01); *G06F 3/167* (2013.01); *H03K 17/962* (2013.01); *H04N 9/3185* (2013.01); *H04N 9/3194* (2013.01); *G02F 1/13338* (2013.01); *G02F 1/163* (2013.01)

(58) Field of Classification Search
CPC ........ G03B 21/00; G03B 21/10; G03B 21/28; G03B 21/145; G02B 6/0031; G02B 6/0088; G02B 6/0096; G02F 1/163
See application file for complete search history.

(56) References Cited

U.S. PATENT DOCUMENTS

| | | | |
|---|---|---|---|
| 2006/0002110 A1* | 1/2006 | Dowling | ................ H05B 45/20 362/249.05 |
| 2018/0004059 A1* | 1/2018 | Jovanovic | ............ G09G 3/3208 |
| 2018/0348617 A1* | 12/2018 | Watanabe | ................ G02B 5/20 |

* cited by examiner

*Primary Examiner* — Sultan Chowdhury
(74) *Attorney, Agent, or Firm* — Womble Bond Dickinson (US) LLP

(57) ABSTRACT

A wall controller is provided. The wall controller includes a projection screen arranged to project a digital image onto the projection screen from the projector, wherein the projector has an optical axis that is non-orthogonal to the projection screen. The wall controller includes a housing having the projection screen mounted thereto. A housing is dimensioned to fit a second end of the housing through an aperture in a first wall, fit the second end into a wall space between the first wall and a second wall, and fit a majority of the first end of the housing into the aperture until the projection screen is parallel to a surface of the first wall. The aperture dimensioned to fit the first end of the housing or the front portion of the projection screen.

20 Claims, 18 Drawing Sheets

Related U.S. Application Data

(60) Provisional application No. 62/381,378, filed on Aug. 30, 2016.

(51) Int. Cl.
*G06F 3/0488* (2013.01)
*G03B 21/10* (2006.01)
*G03B 21/28* (2006.01)
*G06F 3/16* (2006.01)
*H03K 17/96* (2006.01)
*G02F 1/1333* (2006.01)
*G02F 1/163* (2006.01)

DYNAMIC USER CONTROL SYSTEM

BACKGROUND

Wall controllers, for diverse devices and control of functions such as thermostats, hot water heaters, air-conditioning, ventilation, lighting, burglar alarms, electrochromic windows, intercoms, electric gates, etc., are available in many sizes, shapes and appearances. A typical wall controller or other controller, interface or user interface platform mounts to a wall, partition or other surface of a home, office, factory or other building, and communicates wirelessly or through wires (within or attached to a wall) to devices controlled by the wall controller. Functionality, features, design aesthetics and available space are factors in the design of a wall controller. A wall controller that mounts entirely to, and not within, a wall may appear bulky and utilitarian, and be limited in features by available size of the wall controller and wall space allocated to the wall controller. Controllers also have an impact on the design of a home. Devices hanging obtrusively on a wall pull attention away from architecture itself and towards the device. Subtlety of added elements in a high-end home environment is important for respect of the environment. Installation constraints imposed by wall spacing (e.g., inner wall space) and the desire to minimize the number and size of holes or other visible alterations made to or in the wall, and complexity of installation may serve as barriers to the ability to add further features to wall controllers. It is within this and further design contexts that the present embodiments arise.

BRIEF DESCRIPTION OF THE DRAWINGS

The described embodiments and the advantages thereof may best be understood by reference to the following description taken in conjunction with the accompanying drawings. These drawings in no way limit any changes in form and detail that may be made to the described embodiments by one skilled in the art without departing from the spirit and scope of the described embodiments.

DETAILED DESCRIPTION

Figure 1A:
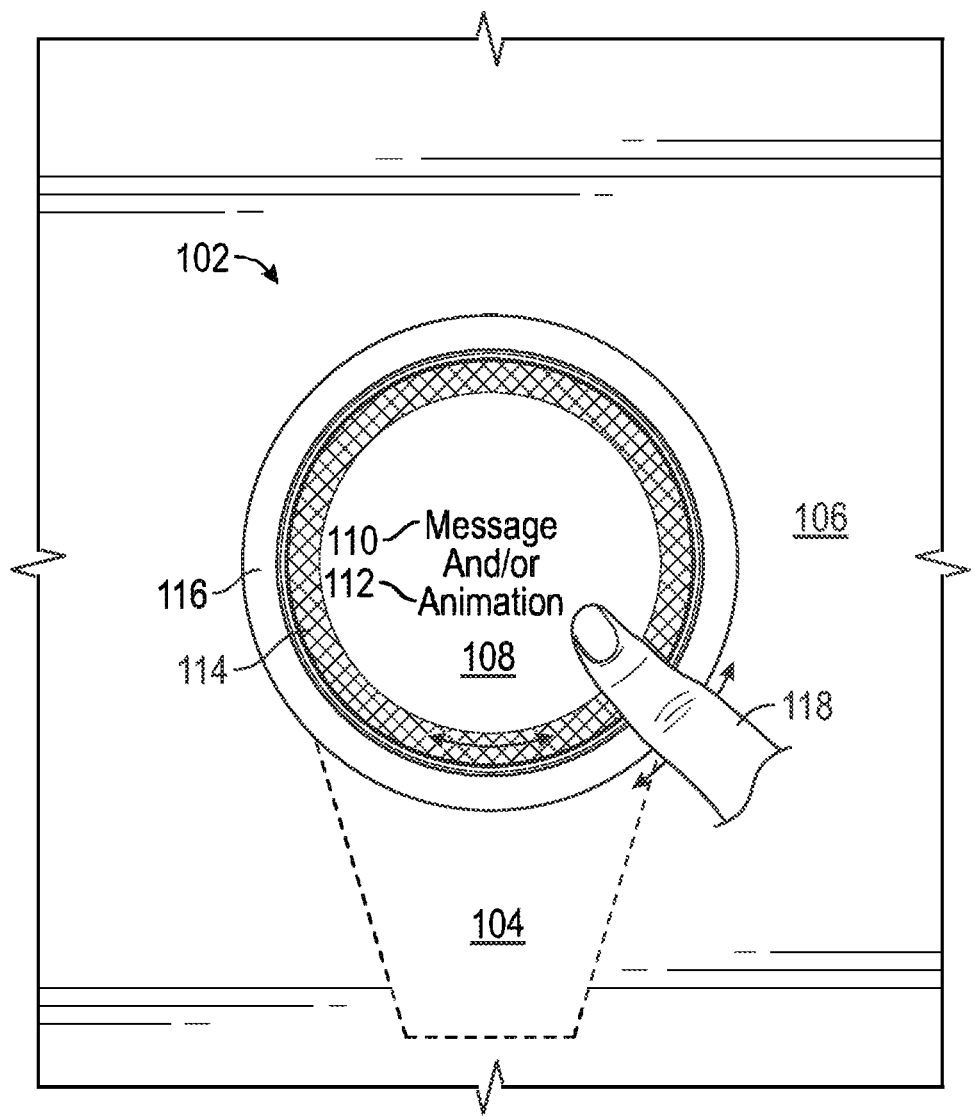
FIG. 1A is a front view of a wall controller mounted to a wall and showing a message and/or animation on a rotatable screen while also projecting a glow onto the wall in accordance with some embodiments.

A dynamic user control system for use in lighting or energy control systems is described herein. The light control or energy control systems may include smart windows that are devices such as windows or doors having a computer processor and/or connectivity to the internet. In some embodiments the smart windows may be electrochromic devices. Other systems such as lights, non-electrochromic windows and doors, HVAC systems, or cooling or heating systems may also be part of the lighting or energy control systems. Embodiments of the dynamic user control system provide a user to interact with and control the lighting or energy control systems. The dynamic user control system may include user input devices such as a wall controller, various types of wall switches, a user app on a mobile device, or a voice control device. The dynamic user control system may be augmented by one or more sensors. The user input devices of this dynamic user control system may be able to communicate directly with a smart window through wired or wireless communications, and may also be able to communicate with a smart window through the internet or through a local area network. In one embodiment a user input device or multiple user input devices of the dynamic user control system may communicate with the electrical drivers of a smart window using a wireless mesh network. In another embodiment a user input device or multiple user input devices of the dynamic user control system may communicate with the electrical drivers of a smart window though a local gateway device that passes the communications through a cloud network or the internet.

In an embodiment of the present invention, a user input device of the dynamic user control system or of any user control system may be a wall controller. The wall controller described herein may be for mounting to a wall and control of household, office, industrial or other systems, and has a rotatable rear projection touchscreen for manual input and visible output. A message or animation projected from a projector hidden in the wall onto the rear projection screen stays level (i.e., at a fixed orientation) relative to the wall for viewing even while a front screen, on which the image is visible, is rotated by a user finger for input. Arrangement of the components and dimensions of the housing purposefully support installation through a hole in the wall, sized to fit the viewable, rotatable face of the wall controller, with the backside components of the wall controller, inside the housing, fitting in the wall space between two walls. Some embodiments feature a glow or animation projected onto the wall, surrounding the rotatable touchscreen, and/or images or animation projected onto an opposing wall.

In some embodiment, a wall controller is provided. The wall controller includes a housing, dimensioned to insert into an aperture in a wall and mount to the wall with a majority of the housing behind a front surface of the wall. The wall controller includes a transparent or translucent touch film mounted in fixed relation to the housing and a transparent or translucent rotatable viewscreen in rotatable relation to the housing, in front of and overlapping the transparent or translucent touch film. The wall controller includes electronic and optical components mounted to the housing to show an image visible on or through the transparent or translucent rotatable viewscreen and sense, via the transparent or translucent touch film, position or movement of one or more fingers on or near the transparent or translucent rotatable viewscreen. The wall controller can receive audio commands and interpret the audio commands to distribute instructions to electrochromic devices in some embodiments. A wall switch may also receive audio commands and distribute or interpret the commands to transmit the commands or instructions to other wall switches or to electrochromic devices.

FIG. 1A is a front view of a wall controller 102 in accordance with the present disclosure, mounted to a wall 106 and showing a message 110 and/or animation 112 on a rotatable screen 108 while also projecting a glow 116 or image onto the wall 106. A finger 118 of a user is shown touching a textured outer region 114 of the rotatable screen 108, to rotate the rotatable screen 108. The textured outer region 114 could have micro texture, macro texture, or be of a different finish, material or paint than an inner region of the rotatable screen 108, so as to have a grippy effect on a finger. Touching outer region 114 could increase or decrease a setting in a device controlled by the wall controller 102, which could be accompanied by a message 110 or animation 112 displayed on the rotatable screen in response to such input in some embodiments. A user can also tap a finger 118 on the rotatable screen 108 or move or slide a finger 118 along the rotatable screen 108, which can detect all such finger touches or movement. In some embodiments, an inner region, i.e. inside of the textured region 114, of the rotatable screen 108 is smooth to suggest to the user that finger taps or slides are appropriate in this inner region, and to allow one or multiple finger sliding. This may include a matte finish as opposed to a glossy surface, although various surface finishes or textures could be appropriate. Texturing in the textured outer region 114 could be bumps, ridges, roughness, a wavy surface, a series of concentric raised circles around the rim, geometric shapes, crosshatching, or other deviation from a smooth flat surface to suggest to the user that finger placement for rotation of the rotatable screen 108 is appropriate in this textured outer region 114. However, further embodiments are smooth or textured across the entirety of the rotatable screen 108 and rely on visual cues for finger placement of the user. Variations of this, with some textured regions and some smooth regions, are readily devised. Visual cues could also be applied by projected image, and appear only when appropriate to a control, mood or other scenario.

Figure 1B:
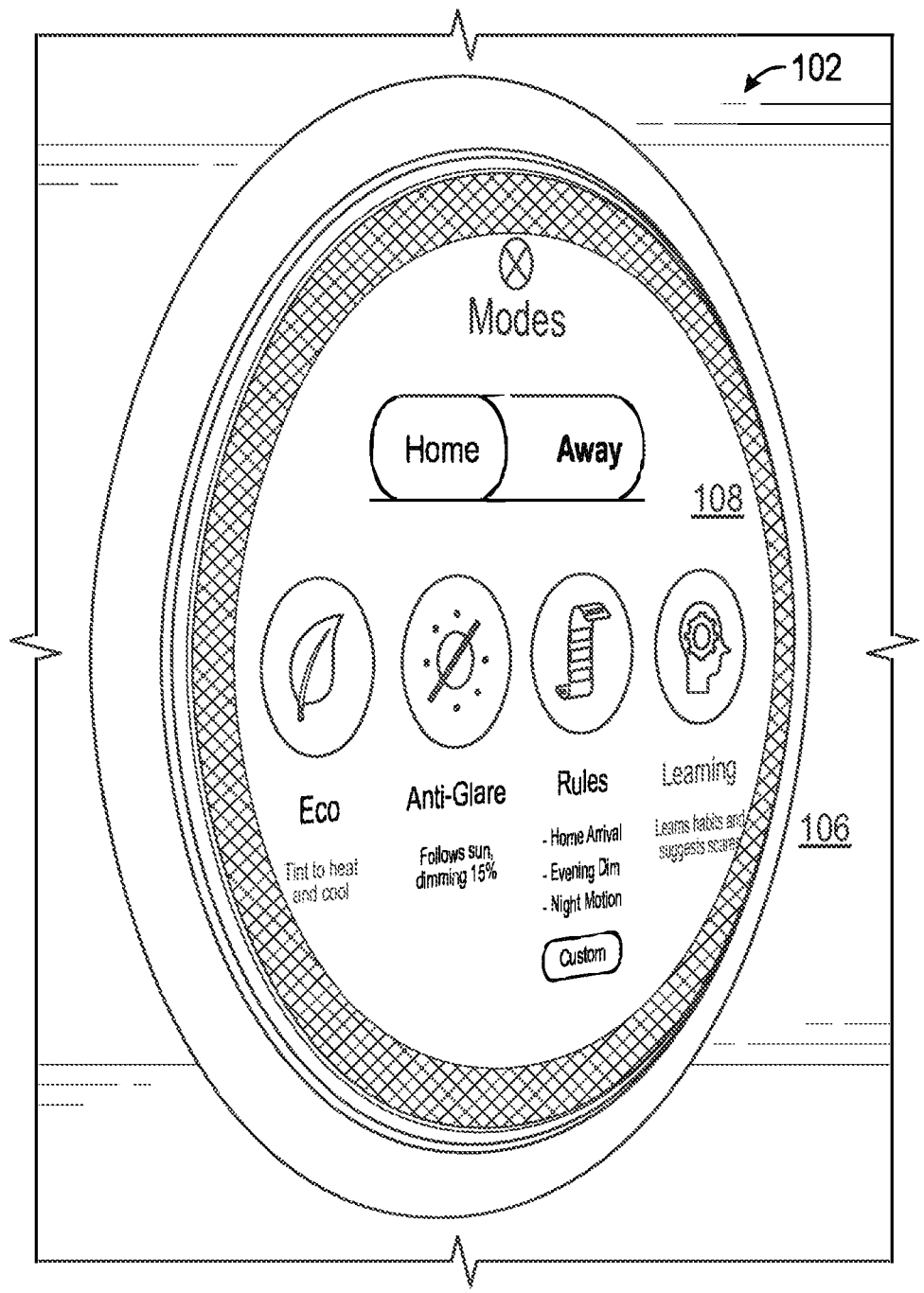
FIGS. 1B and 1C are perspective views of a wall controller illustrating example user interfaces in accordance with some embodiments.
Figure 1C:
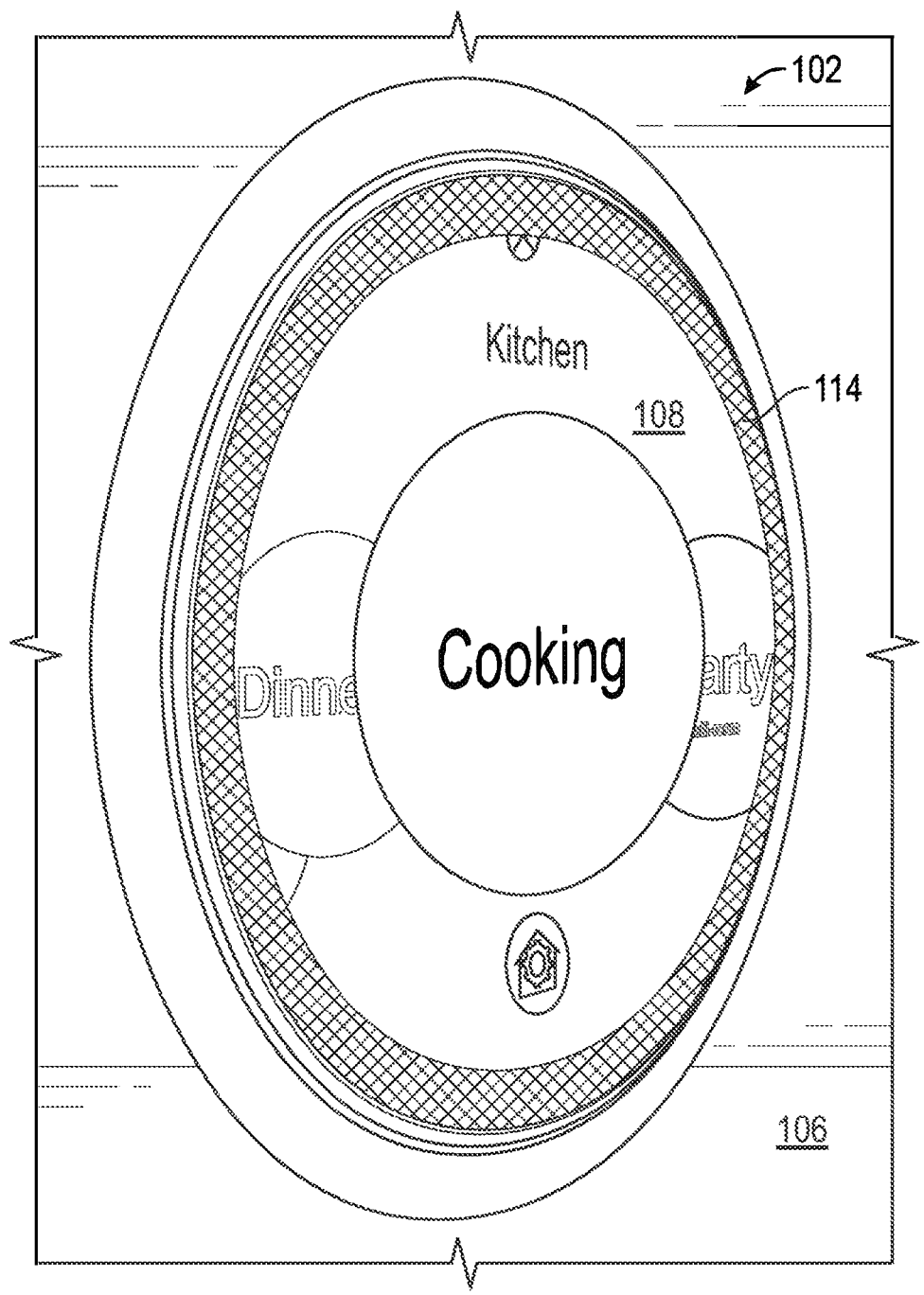

A majority or the entirety of the housing 104 is inside the wall 106 as illustrated in FIG. 1A, or more specifically in the wall space between the wall 106 and another wall or surface. In various embodiments, the rotatable screen 108 is flush with the front surface of the wall 106 (e.g., embodiments without the projected glow 116 onto the wall 106), or is raised slightly from the front surface of the wall 106 (e.g., embodiments with the projected glow 116 onto the wall 106). FIGS. 1B and 1C illustrate various embodiments with examples of user interfaces illustrated on the rotatable screen 108. It should be appreciated that various user modes and sub-menus within the different modes may be employed based on the application as FIGS. 1A and 1B are examples and not meant to be limiting.

Figure 2:
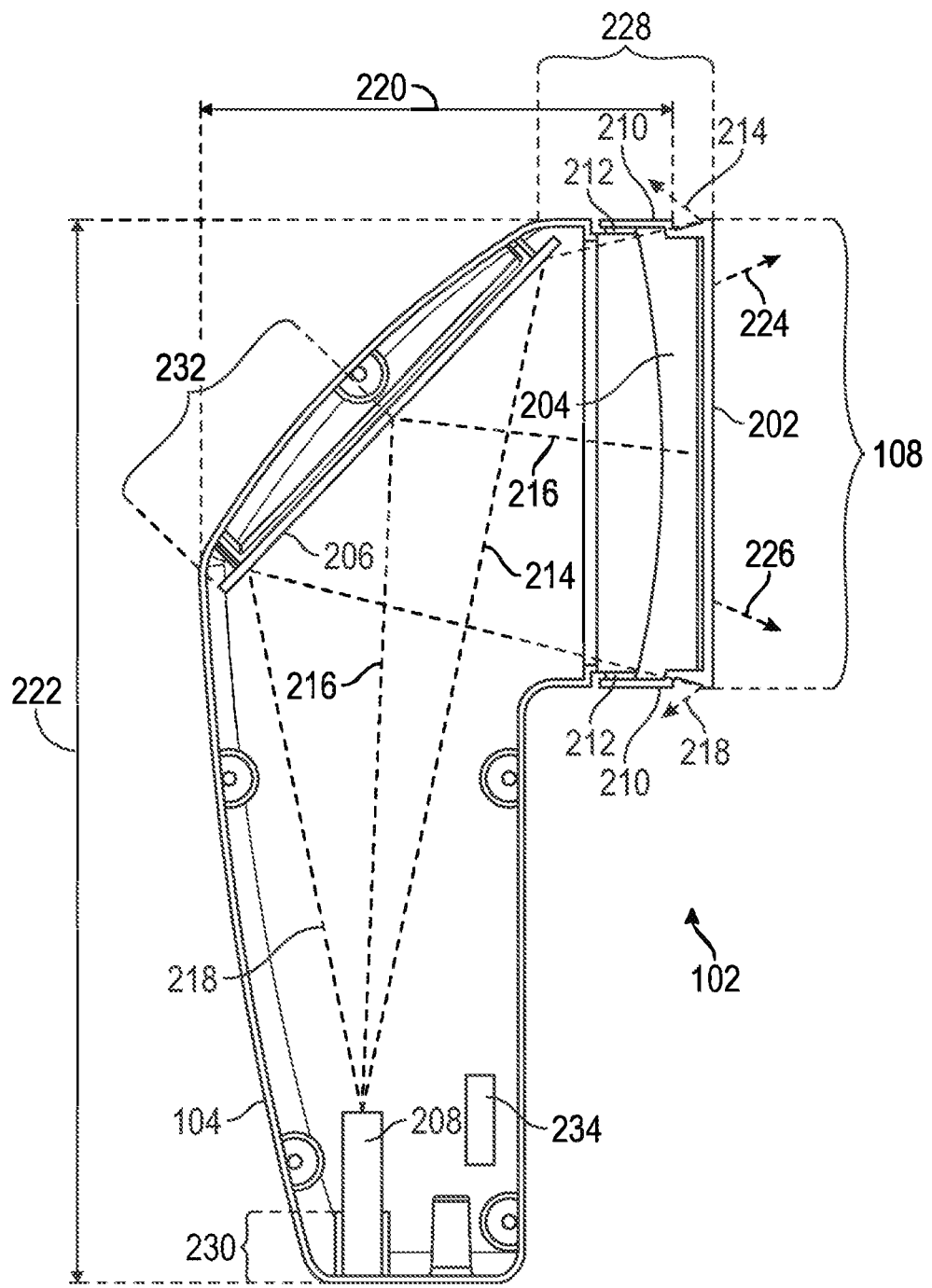
FIG. 2 is a side view of the wall controller of FIG. 1, depicting a portion of an image projected from a projector onto a rear projection screen, and a further portion of the image reflected outward and backward by a shaped, reflective rim surrounding the rear projection screen in accordance with some embodiments.

FIG. 2 is a cutaway side view of the wall controller 102 of FIG. 1A, depicting a portion of an image projected from a projector 208 onto a rear projection screen 204, and a further portion of the image reflected outward and backward by a shaped, reflective rim 210 surrounding the rear projection screen 204. The rear projection screen 204 and a rotatable front screen 202, together form the rotatable screen 108. These components of the rotatable screen 108 are mounted to a first end 228 of the housing 104. This is accomplished, in the embodiment shown, with a bearing 212, for example a ring bearing, rotatably coupling the rotatable front screen 202 and the rear projection screen 204, which is attached to a first end 238 of the housing 104. The reflective rim 210 (i.e., a reflective outer edge) is attached to or at the boundary of the rotatable front screen 202 and surrounds a boundary of the rear projection screen 204. A projector 208, which could also be termed a rear projector since it projects onto the rear projection screen 204, is mounted internal to a second end 230 of the housing 104. A controller 234, or more than one controller, could be mounted in various locations in the housing 104, outside the housing, in a second housing or integrated into the projector 208, in various embodiments. The controller 234 interprets user input for the wall controller 102 and develops output, in the form of digital images or animation to be projected by the projector 208. In the embodiment shown, a mirror 206 is mounted to a middle section 232 of the housing 104. Selection of mounting arrangement for the projector 208, and use of and mounting arrangement for the mirror 206, are driven by design objectives. These objectives include using a rear projected image with sufficient length beam path to allow for expansion of the beam and a full-size image on the rotatable screen 108, and fitting the housing into a standard wall space for ease of installation and attractive appearance of the wall controller 102. Off-axis projection, without the mirror 206, could also be used for placement of the projector 208 in a further embodiment. In reflected-beam and off-axis projection versions, the projector is other than on a line perpendicular to the rear projection screen. That is, projector 208 has an optical axis that is non-orthogonal to rear projection screen 204 and rotatable front screen 202. In still further embodiments, lenses or combinations of lenses and mirrors could be used for various folded and or lensed beam paths and other housing arrangements. A projector with sufficiently wide beam or rapid beam expansion may be employed, or a system of lenses achieves this, to enable use of a direct, on-axis projection arrangement.

In one embodiment, the overall depth 220 of the housing 104 is less than or equal to four inches, so that the housing 104 of the wall controller 102 fits into a wall space between standard-spaced walls in a home or commercial building, as shown in FIG. 3. The shape of the housing 104, and overall length 222 of the housing 104 are also dimensioned to so fit, and in some embodiments the overall length 222 of the housing 104 can be greater than the overall depth 220 of the housing 104, to accommodate a beam path from the projector 208 to do the rear projection screen 204.

In the embodiment depicted in FIG. 2, a majority of the image from the projector 206 reflects off of the mirror and is rear-projected onto the rear projection screen 204 and/or the rotatable front screen 202. That is, in various embodiments, the image is projected onto a translucent rear projection screen 204 and is visible through a transparent (or translucent) rotatable front screen 202, or is projected through a transparent (or translucent) rear projection screen 204 and is visible as projected onto a translucent rotatable front screen 202, or is visible on both the rear projection screen 204 and the rotatable front screen 202. Preferably, one or the other of the rear projection screen 204 and the rotatable front screen 202 is transparent, and the other is translucent. Translucency can be produced by using an opaque substrate with holes, such as a mesh or a grill, or by tinting transparent material, thinning opaque material, using a textile, mesh, grill, diffusion film, etc. In further embodiments, other optical components could be applied to produce an image.

This projection is shown in FIG. 2 with the center ray 216 of the projected image, and is seen from the front of the wall controller 102 as the full-screen message 110 (see FIG. 1A) and/or animation 112. Since the projector 208 and mirror 206 are in fixed arrangement with the housing 104, the projected image stays in fixed orientation relative to these components and the wall 106 to which the wall controller 102 is mounted, even as the rotatable front screen 202 is rotated. Moreover, in some embodiments the projected image extends far enough laterally to fill the rear projection screen 204 and/or the rotatable front screen 202, all the way to the edges. In some embodiments, for a frameless screen result, a light piping effect in the rotatable front screen 202 could be applied to lighten shaded areas. In some embodiments, the projector 208 is directed, for example by a controller, to rotate the projected image to match rotation of the rotatable front screen 202. For example, one or more arrows or other symbols could be shown moving with rotation of the rotatable front screen 202, in the projected image.

In some embodiments, and as shown in FIG. 2, the projected image is greater in extent than the rear projection screen 204 and the rotatable front screen 202, as depicted with the outer rays 214, 218. A portion of the projected image, e.g. these outer rays 214, 218, escapes through a transparent or translucent portion, or an opening such as a hole, window or absence of material, of the housing 104, a transparent or translucent portion of a skirt or other support of the rear projection screen 204, a gap between the housing and the rear projection screen 204, or some other window or transparent or translucent area, and reflects outwards and backwards off of the shaped, reflective rim 210 or outer edge of the rotatable screen 108. In a further embodiment, light escapes straight out to project on outside elements or an opposite wall, etc. When the wall controller 102 is mounted to a wall 106, as shown in FIGS. 1 and 3, this outer reflected image appears as the glow 116 on the wall 106. In the embodiment shown, the shaped reflective rim 210 is a radially symmetric skirt or other extension rearward of the rotatable front screen 202, and could be painted, plated, or polished for better reflectivity. In various embodiments, the shaped reflective rim 210 is curvilinear, an angled flat surface, multiple angled flat surfaces, or a combination of curved and flat surfaces, for even or graduated light distribution, or could be faceted, ringed, wavy or textured for various reflective effects, etc. In further embodiments, the shaped reflective rim 210 is a skirt or other extension rearward of, aligned with or in front of the rear projection screen 204. Thus, the shaped reflective rim 210 allows for light from the outer rays 214 and 218 to appear to emanate from the wall region external and proximate to the periphery of the housing 104. This light may be referred to as a glow in some embodiments, or may be an image in further embodiments. In some embodiments, the shape is designed to allow a projection closer to the wall interface, or farther from the wall interface, such that, for example it could project elements going away from or towards the device, or a circle around the device, that would expand and contract, e.g. a circle going from one diameter to another diameter.

Depending on optical characteristics of the rear projection screen 204 and rotatable front screen 202, for example a transparent region, some light (e.g., rays 224, 226) could cast an image or a glow on an opposite wall to the wall 106 on which the wall controller 102 is mounted, in some embodiments. This could be useful for mood lighting, or in an emergency, for example to cast a bright red glow, message, image of an arrow pointing to an exit, or a circle oriented to an exit, on the opposite wall.

Figure 3A:
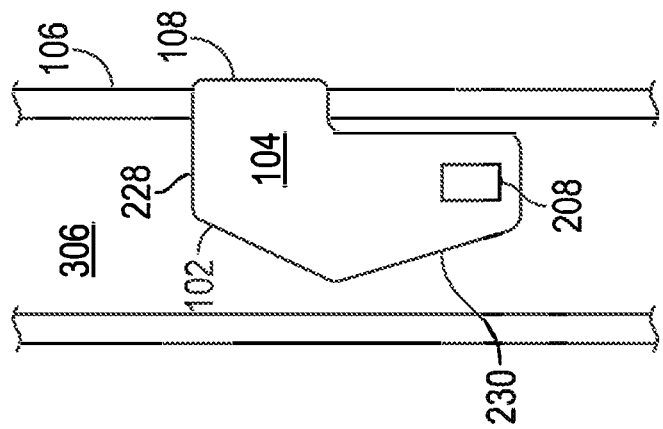
FIGS. 3A-C illustrate an action sequence showing installation of the wall controller of FIGS. 1 and 2 in accordance with some embodiments.
Figure 3B:
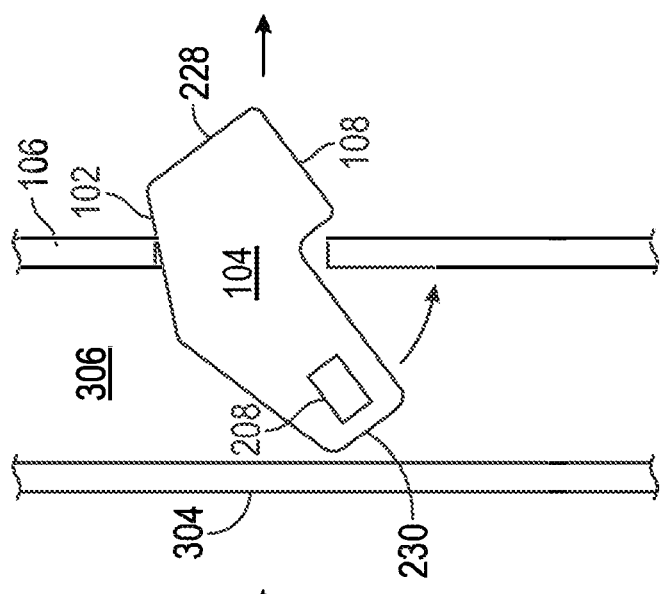
Figure 3C:
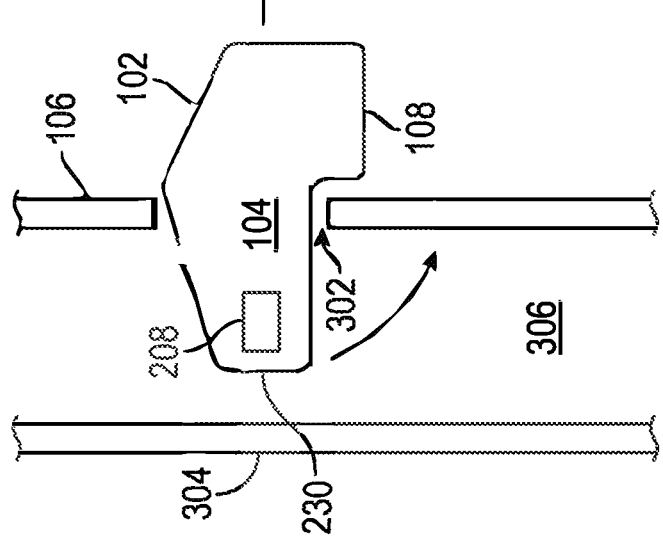

FIGS. 3A-C illustrate an action sequence showing installation of the wall controller 102 of FIGS. 1 and 2. An aperture 302 is made in the wall 106, for example by a user, carpenter or installation technician. Generally, the aperture 302 should be circular and dimensioned to fit the first end 228 of the housing 104 and/or some or all of the rotatable screen 108, or optional mounting hardware, although further embodiments could use other shapes such as an oval or a rectangle, and corresponding cross-sections of the housing 104. The second end 230 of the housing 104 of the wall controller 102 is inserted through the aperture 302 and into the wall space 306 between the wall 106 and a further wall 304. The second end 230 of the housing 104 is then rotated into the wall space 306, downward in this embodiment but the rotation could be sideward or upward in further embodiments. As the downward (or sideward or upward) rotation of the second end 230 of the housing 104 completes, the first end 228 of the housing 104 seats in the aperture 302 in the wall 106, with the majority of the housing 104 in the wall space 306, and the rotatable screen 108 facing outward from the wall 106. The rotatable screen 108 is then flush with the wall 106 (e.g., in some embodiments lacking the reflective rim 210) or nearly flush with the wall 106 (e.g., in embodiments that have the shaped, reflective rim 210 and cast the glow 116 as illustrated in FIGS. 1 and 2). In some embodiments, the second end 230 of housing 104 has a periscope configuration where the second end 230 can extend downward through a periscope mechanism once the controller is situated in place in FIG. 3C. In further embodiments, the housing 104 could fold or unfold into the wall space 306 between the wall 106 and the further wall 304, or extend using a telescoping action. One or more portions of the housing 104 could pivot or hinge relative to another portion of the housing 104, or otherwise deploy into the wall space 306 between the wall 106 and the further wall 304. In some embodiments the wall controller includes the ability to tune the projector once assembled. For example, set screws on a surface of the wall controller may be utilized to adjust the projector to provide for fine tuning the alignment after assembly. In some embodiments 3 set screws may provide for alignment in the x, y, and z directions with one set screw dedicated to each direction. In some embodiments, as light sensor proximate to the projector may be utilized to adjust display brightness based on the brightness/light level sensed in the room.

Figure 4:
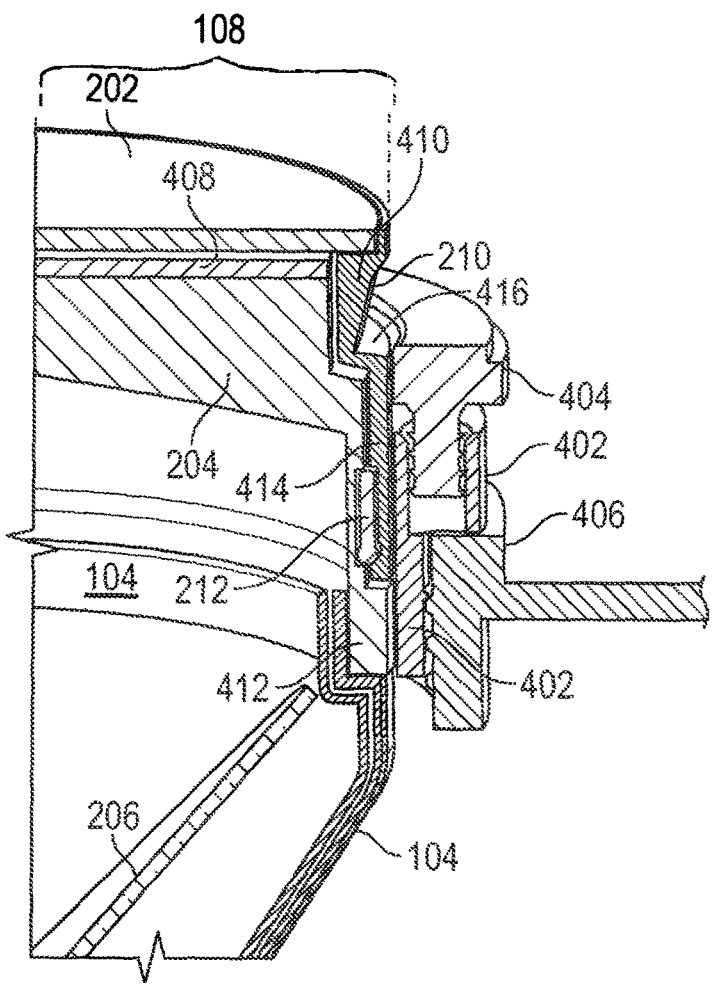
FIG. 4 is a close-up perspective cutaway view with details of portions of a rotatable front screen, a capacitive sensing film, a rear projection screen, a bearing, a base ring, a lock ring and a housing in accordance with some embodiments of the wall controller.

FIG. 4 is a close-up perspective cutaway view with details of portions of a rotatable front screen 202, a capacitive sensing film 408, a rear projection screen 204, a bearing 212, a base ring 402, a lock ring 404 and a housing 104 in an embodiment of the wall controller 102 of FIGS. 1-3. To support rotation of the rotatable front screen 202, the bearing 212 couples the cylindrical rim 414 of the rotatable front screen 202 to the cylindrical rim 412 of the rear projection screen 204. In this embodiment, the bearing 212 is a ring of one, two or more pieces made of Teflon™ or nylon or other slippery or low friction plastic material, with the bearing 212 and both cylindrical rims 412, 414 concentric about a rotation axis of the rotatable front screen 202. Other types of bearings positioned below or behind the rotatable front screen 202 are readily devised. For example, the bearing could attach to the housing 104 and/or the rear projection screen 204, and further variants for installation other than the lock ring 404 and the base ring 402 could be devised. One of the cylindrical rims 414 could be integral with the rotatable front screen 202, and further variants are readily devised in keeping with the teachings herein. In some embodiments, a portion of cylindrical rim 414 has a retention device, such as a bump or bumps, to engage with a corresponding depression or edge of bearing 212, surface of base ring 402, surface of cylindrical rim 412, or a surface of housing 104, etc.

Still referring to FIG. 4, the rotatable front screen 202, in this embodiment a circular disk, has a larger diameter or greater extent than the rear projection screen 204, so that the rotatable front screen 202 overlaps the rear projection screen 204. Likewise, the cylindrical rim 414 of the rotatable front screen 202 has a larger diameter than, and surrounds, the cylindrical rim 412 of the rear projection screen 204. In this embodiment, the rear projection screen 204 and associated cylindrical rim 412 are nested inside of the rotatable front screen 202 and the associated cylindrical rim 414. Since the two screens 202, 204, and the associated two cylindrical rims 414, 412 are coupled together by the bearing 212 and/or through assembly of further components including the housing 104, the rotatable front screen 202 is supported to rotate relative to the rear projection screen 204. The cylindrical rim 412 of the rear projection screen 204 is attached to the housing 104, at the first end 228 of the housing 104. This attaches the entirety of the rotatable screen 108 assembly, as a rotatable rear projection touchscreen, to the housing 104.

A transparent or translucent, capacitive sensing film 408 of FIG. 4, or other touch sensing film or device in various embodiments, is attached to a front (or in some embodiments, rear) of the rear projection screen 204, making this a rear projection touchscreen or clear sensing layer through which a projected image passes, and tuned (e.g., using electronic circuitry and/or the controller 234 in FIG. 2)) to sense a finger 118 (see FIG. 1) on the rotatable front screen 202. In some embodiments, the capacitive sensing film 408 is inside the rear projection screen 204, e.g., inside the disc, for example by layering, buildup, lamination, deposition, in-mold decoration or in-mold-labeling process. The capacitive sensing film 408 can sense the finger 118 through the thickness of the rotatable front screen 202, and can even sense the finger 118 at an edge of the rotatable front screen 202 extending past an edge of the rear projection screen 204 and associated edge of the capacitive sensing film 408, or even a finger 118 near but not touching, in some embodiments. With such sensitivity, the capacitive sensing film 408 can sense a finger touch, a finger slide, or finger movement to rotate the rotatable front screen 202. In this embodiment, this is the sole mechanism by which rotation of the rotatable front screen 202 is detected. That is, there may be no optical or magnetic encoders, no camera detection of finger position, and no mechanical coupling to gears or a shaft to a mechanical or electromechanical encoder, etc., although these could be used in other embodiments. Associated electronics, for example in a controller 234 (see FIG. 2), interpret the capacitive sensing film 408 signal(s) to determine input from a user as above, and may also develop control signals for whichever device(s) the wall controller 104 is controlling or otherwise interacting with, or communicate signals to another controller that does so. In some embodiments capacitive sensing film 408 is a transparent or translucent film.

To manage the light path for the portion of the digital image that gets reflected by the shaped, reflective rim 210, some embodiments of the rotatable front screen 202 have a step feature 416 on the cylindrical rim 414 of the rotatable front screen 202, which lets light from that portion of the digital image through to the reflective rim 210. This could also be accomplished using spokes and gaps, or other shapes in a transparent or translucent material. Also, some embodiments have a light pipe 410 in part of the cylindrical rim 414, for example behind the shaped, reflective rim 210, or forward of the shaped, reflective rim 210 up to the rotatable front screen 202. Light pipe 410 allows the visible part of the cylindrical rim 414 to have a glow surrounding or adjacent to the rotatable front screen 202. Light pipe 410 is configured to enable light entering one region of the light pipe to be emitted at another region, e.g., toward a surface of reflective rim 210, to give the appearance of a glow rim around the periphery of front of front screen 202. In some embodiments, a reflective surface on the reflective rim 210 creates a shadow along the periphery of the rotatable front screen 202. Because light projected to the rotatable front screen 202 is blocked in that shadow area, the light pipe 410 brings light to the surface of the rotatable front screen 202 where regular projection cannot go, so that all of the surface of the rotatable front screen 202 is lit.

Referring to FIGS. 3 and 4, for ease of installation and professional or high-end appearance, some embodiments of the wall controller 102 have installation pieces, examples of which are shown in FIG. 4. A base ring 402, or in some embodiments a first base ring 402 and a second base ring 406, are pieces that can be installed to the aperture 302 in the wall 106, e.g., by press fit or with fasteners, fillets or adhesives. In order for the pieces to work in the assembly procedure shown in FIG. 3, the first base ring 402 may be dimensioned so that the second end 230 of the housing 104 fits through the first base ring 402 and the first end 228 of the housing 104 fits into the first base ring 402. After the housing 104 is inserted through the aperture 302, as described with reference to FIG. 3, and the rotatable screen 108 assembly is properly aligned flush or nearly flush with the wall 108 (depending upon embodiment), a lock ring 404 is pressed into the first base ring 402, to lock the housing 104 in place in the wall 106. The lock ring 404 has barbs, as shown, threads, hooks, fasteners or other securing mechanism that mates to the first base ring 402 and/or the second base ring 406. The lock ring 404 could have a front surface flush to the wall 106, with a majority of the lock ring 404 below the surface of the wall 106, or could have a back surface flush to the wall 106 or recessed slightly into the wall 106 and the front surface protruding slightly from the wall 106 or overlapping a portion of the wall 106, in various embodiments. In further embodiments, the first base ring 402 or the second base ring 406 could fix to the wall without need for the lock ring 404.

In embodiments with the shaped, reflective rim 210 it is desired that the rotatable front screen 202 be nearly flush with the top surface of the lock ring 404 and/or the front surface of the wall 106 for aesthetic purposes, although further embodiments could extend further from the wall 106. For example, the height of the shaped, reflective rim 210 could be as small as about one millimeter or as great as about one inch, although other dimensions could be used. A portion of the reflective rim 210 could be sunken below the front surface of the wall 106 in some embodiments. Reflective rim 210 is depicted having an arc shape in some embodiments but this is not meant to be limiting as alternative shapes for the outer edge of the reflective rim may be integrated with the embodiments. In some embodiments, an encoder ring having metal lines or laser etched lines disposed on a surface may be utilized to allow a sensor to detect rotation of the rotatable front screen. The encoder ring may be integrated with one of the rings described above or may be a separate ring of the wall controller. The wall controller may also include a heat sink disposed within the unit to dissipate heat in some embodiments.

Figure 5:
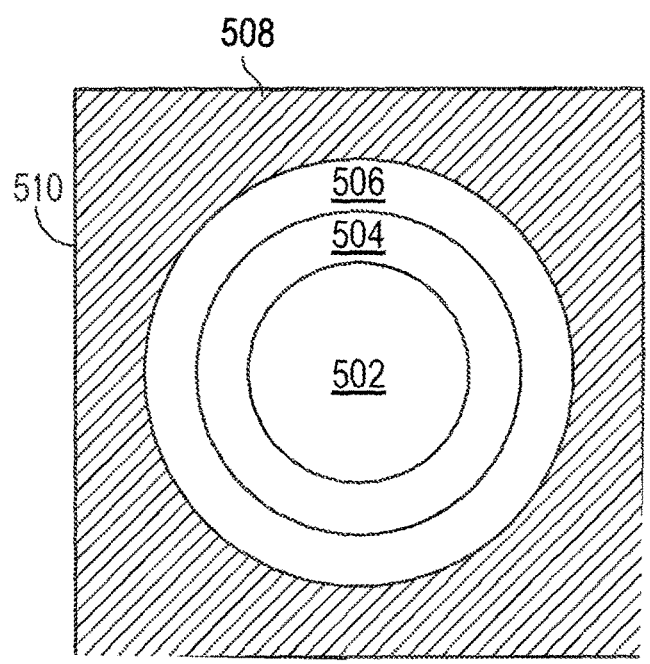
FIG. 5 depicts regions of a digital image suitable for projection from the projector in embodiments of the wall controller of FIGS. 1-4 in accordance with some embodiments.

FIG. 5 depicts regions of a digital image 510 suitable for projection from the projector 208 in embodiments of the wall controller of FIGS. 1-4. Portions of the digital image 510 are circular, to project onto circular optical components as described above. However, in further embodiments, other shapes of these optical components could be used, or off-axis projection could be used, and this could result in a different shape for the digital image 510 such as oval for off-axis projection onto circular optical components, or other geometric shapes. In the embodiment shown, a circular, central region 502 projects onto the backside of the rear projection screen 204 or the rotatable front screen 202, i.e., the rotatable screen 108. A first ring region 504, surrounding the central region 502, projects onto the light pipe 410 to illuminate the rim surrounding the rotatable front screen 202, in embodiments that have the light pipe 410. A second ring region 506, surrounding the first ring region 504, projects onto the reflective rim 210, in embodiments that have the reflective rim 210. An outer dark field 508, surrounding the second ring region 506, the first ring region 504 and the central region 502 is black or dark (e.g., the lowest value for each of the red, green and blue components in the pixel values) so that stray light from the image does not bounce around the housing 104 and the image does not need physical masking. In further embodiments, masking is added to avoid internal reflections of residual light, since the darkest level available from a specific projector 208 may not equate to a total absence of light. Variations on the digital image 510, with additional regions, combined or overlapping regions, spaces between the regions, or fewer regions, are readily devised. One or more further regions could be added around the second ring region 506, for example to project straight out of the wall interface and onto other elements in the environment such as an opposite wall. Or, one or more further regions could be defined within one of the regions 502, 504, 506, corresponding to a transparent region in the rear projection screen 204 and rotatable front screen 202, for projecting onto other elements in the environment. Each of these regions 502, 504, 506 and/or further regions could be provided with an image independent of the other regions, or these could be coordinated, for various effects. For example, the central region 502 could have a message or index markings, or an animation corresponding to perceived rotation of the rotatable front screen 202 or corresponding to action on a device or system being controlled by the wall controller 102. The first ring region 504 or the second ring region 506 could be animated, to show perceived rotation of the rotatable front screen 202 or action on a device or system. The first ring region 504 could have a constant or changing color or intensity, for example pulsating or blending from one color to another, or could have sections or segments that are stationary or move. The same functionality could be achieved with the second ring region 506, coordinated with or independent of the first ring region 504, or the central region 502. A clock could be implemented with hands on one or more of the regions 506, 504, 502. Indoor or outdoor temperature could be indicated similarly, as could other weather information, for example with a combination of symbols, words or animation. Night and day, phases of the moon, seasonal displays, photographic images or movie or video images (still or moving), abstract art, etc., are all candidates for display using one or more of the regions 502, 504, 506 of the digital image and corresponding display on the rotatable screen 108, the glowing rim or projection surrounding the rotatable screen 108, and the glow 116 or projection projected onto the wall 106 or other portion of the environment. Embodiments could react to sound or music, or size, movement, proximity or changing distance of a user, for example by being dark in a quiescent state but waking up or increasing in glow or brightness as a user approaches, with appropriate sensor(s) in this or another system to which the window controller 102 is connected and communicates.

Figure 6:
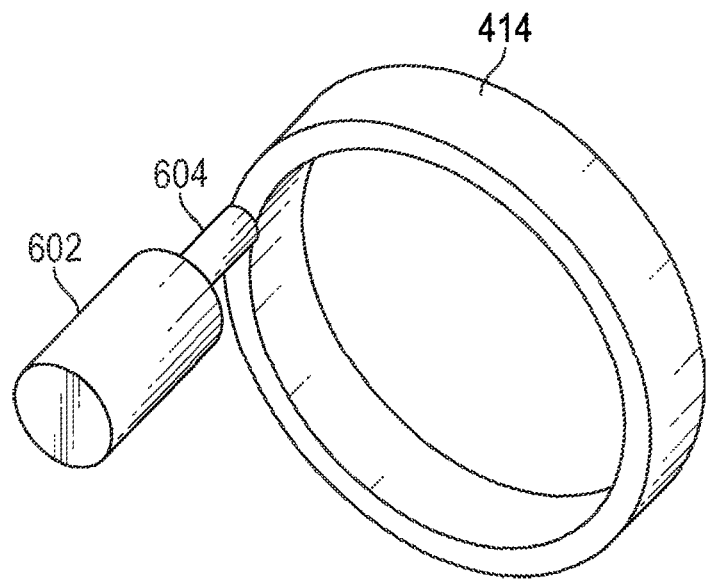
FIG. 6 is a perspective view of a brake for stopping rotation of a rotatable front screen of a wall controller in accordance with some embodiments.

FIG. 6 is a perspective view of a brake for stopping, slowing, countering or otherwise resisting rotation of the rotatable front screen 202 of FIGS. 1, 2 and 4. There are many ways a brake could be implemented, such as a drum brake, a disk brake, a stepper motor operated in reverse, a band brake, a clamp, etc. In addition, there are many mechanisms for the brake to be attached to or interact with the rotatable front screen 202, such as directly, or through a rim, a shaft, gears, a region of a surface, etc. In the embodiment shown, a solenoid 602 has a plunger 604 which is electromagnetically activated (e.g., by the controller 234) to press against the cylindrical rim 414 of the front screen 202, slowing and stopping rotation of the rotatable front screen 202. Variations, in which the plunger 604 presses or pulls elsewhere, and further embodiments as described above, e.g., to slow down, increase or decrease friction and resistance to rotation, are readily devised in keeping with the teachings herein. Some embodiments could be operated under computer control, others could be directly reactive to a switch, e.g., a capacitive switch, or other sensing device, or a circuit coupled to the capacitive sensing film 408, etc. In some embodiments a magnet may be utilized as an eddy current break where an electrical break is created by a magnetic field to slow the metal ring without physically contacting the ring. The amount of slowing may be proportional or inversely proportional to an amount of current sensed.

Figure 7:
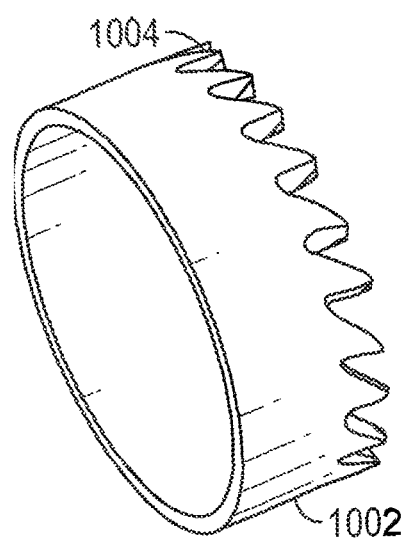
FIG. 7 is a perspective view of a tool for installing an embodiment of the wall controller.

FIG. 7 is a perspective view of a tool for installing an embodiment of the wall controller 102. The tool has a shortened cylinder body 1002, with teeth 1004. When the tool is rotated on a wall (e.g., by hand or by an electric motor-equipped tool such as a drill), the teeth 1004 cut a circular hole in the wall 106. In some embodiments, the tool or a portion of the tool is left in the wall, and becomes a base ring through which the housing 104 of the wall controller 102 is inserted. The tool, as a base ring, then retains the housing 104 to the wall 106. Retention could be accomplished using a fastening or latching mechanism, adhesive, or one or more trim pieces as described above.

Figure 8A:
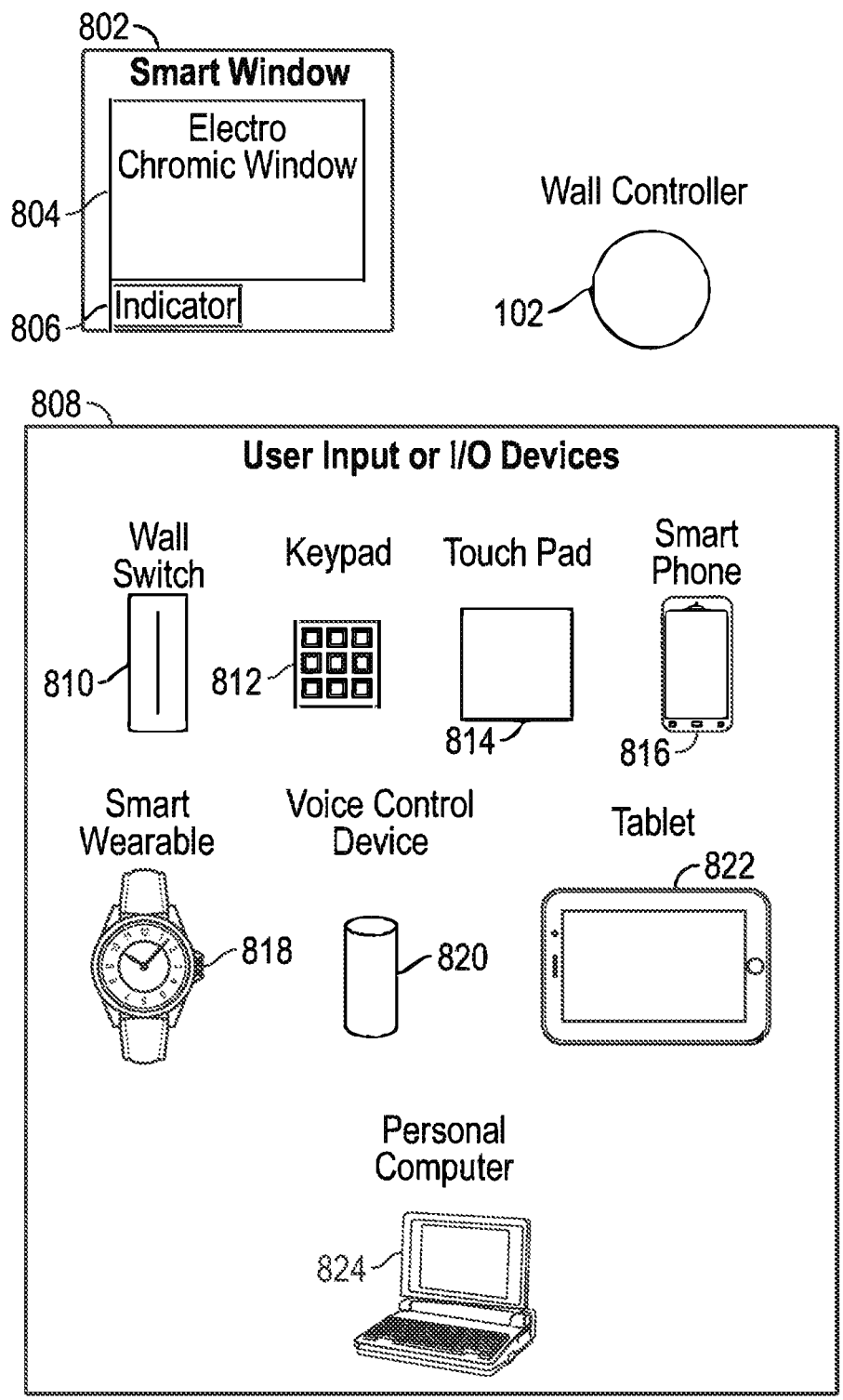
FIG. 8A depicts an embodiment of a dynamic user input control system for smart devices including a number of varied user input devices, one of which may be the wall controller according to embodiments described herein.
Figure 8B:
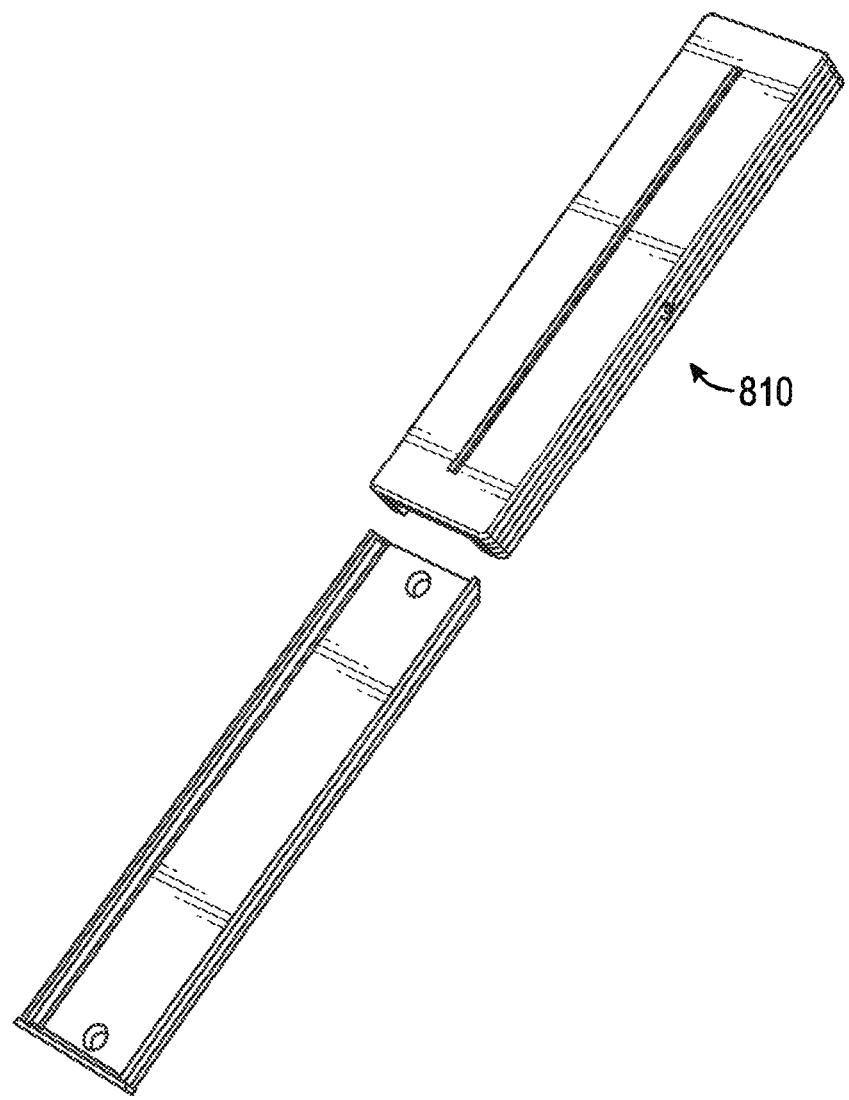
FIGS. 8B and 8C illustrate a slider controller in accordance with some embodiments.
Figure 8C:
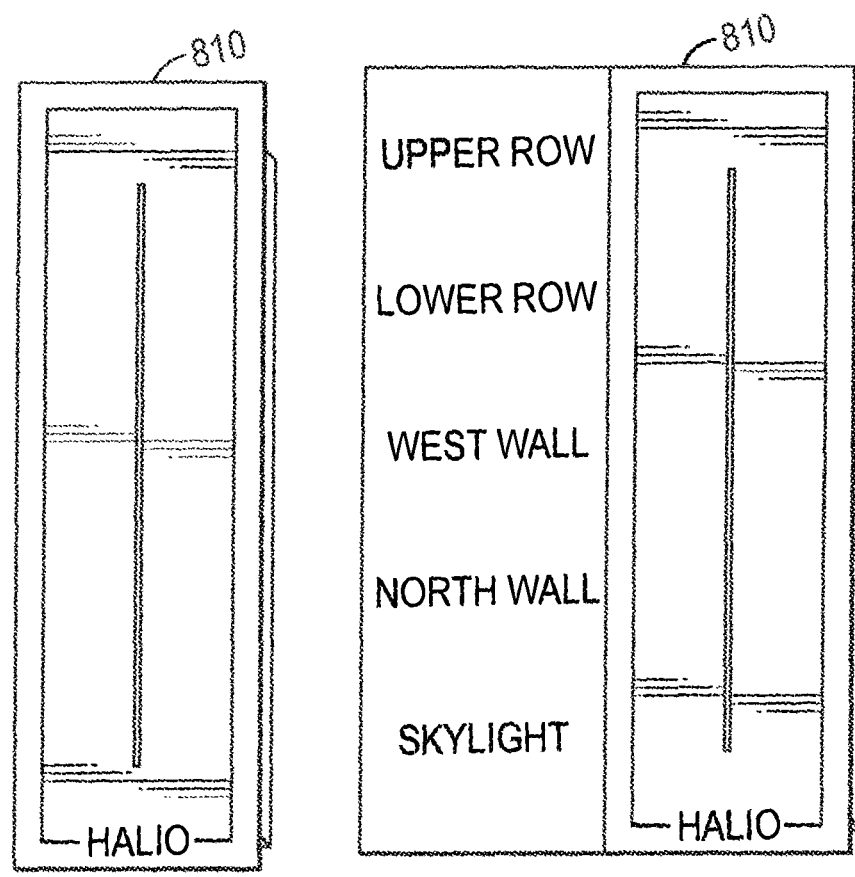
Figure 9:
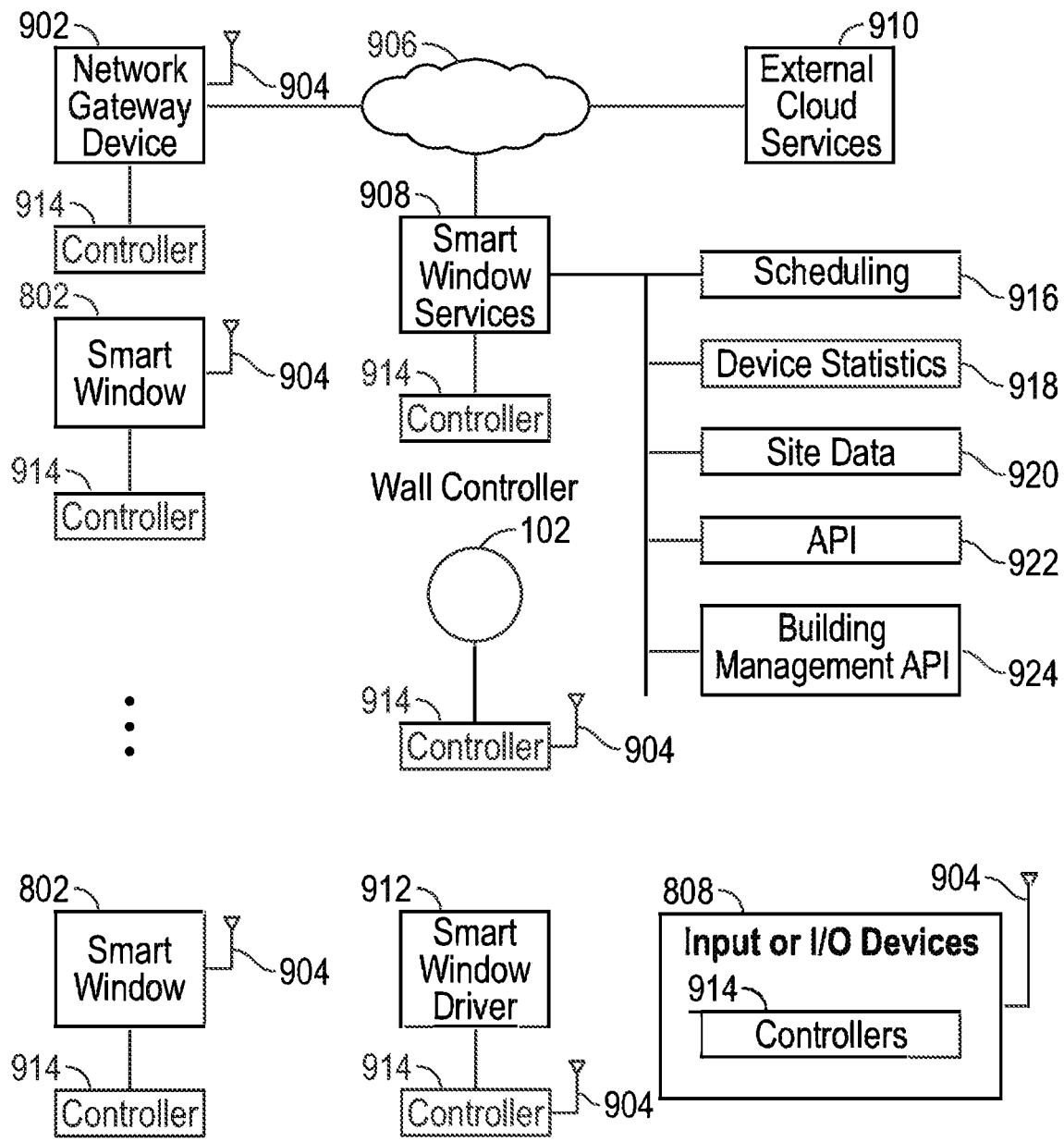
FIG. 9 depicts an embodiment of an overall control system for smart devices, such as smart windows, which receives user input from, and communicates with, a dynamic user input control system.

FIG. 8A depicts an embodiment of a dynamic user control system for smart devices including a number of varied user input devices, one of which may be the wall controller 102 according to embodiments described herein. The wall controller 102 and one or more input or I/O (input/output) devices 808 interact with each other and/or interact with one or more smart devices, in this example a smart window 802. The smart window 802 has an electrochromic window 804 with controllable light transmissivity, and in some embodiments an indicator 806, for example attached to the electrochromic window 804, or attached to or integrated with a frame of the smart window 802. The indicator 806 could be a liquid crystal display (LCD) or one or more LEDs (light emitting diodes) such as an organic light emitting diode (OLED), etc., and could indicate relative transmissivity of the electrochromic window 804, or changes to the transmissivity of the electrochromic window, etc. Various input or I/O devices 808 are illustrated, and further input or I/O devices could also be used for input to or control of smart devices. A wall switch such as slider 810 could be implemented with an elongated touchpad, or a slidable knob with encoding, sensing or other input device coupled to the slidable knob. The wall switch may have a tactile keypad. In some embodiments, the wall switch could have an output device such as a liquid crystal display, or multiple LEDs, perhaps even three color or RGB (red green blue) LEDs. The wall switch 810 could be mounted, e.g., on a wall, or portable, as a remote control, and could have one or more buttons or keys in various embodiments. In one embodiment the wall switch 810 may be a toggle or bar with buttons on either end of the bar to allow a user to change the tint level of an electrochromic smart device. As illustrated, a slider 810 may have a portion mounted to a wall and a portion slidably affixed to the portion mounted to the wall to enable access to batteries, among other items. A keypad 812 could be mounted, e.g., to a wall, or portable, and include multiple buttons or keys, which could be physical devices or regions of a touchpad. A touchpad 814 could be mounted, e.g., to a wall, or portable, and able to sense one or more fingers. Touchpads are available with display output, e.g., LCD displays, or other types of LED displays. A smartphone 816 or other mobile device could have one or more applications or "apps" and serve as a user input or I/O device. Smart wearables 818 may also serve as a user input device, such as a watch, a collar, a badge, a key fob, ear attachable devices, etc., may have Bluetooth™ connectivity. A tablet 822, with computer and touchscreen capabilities, could have one or more applications or "apps" to serve as an input or I/O device. Similarly, a personal computer 824 (e.g., a tower, laptop, notebook, etc.) could have one or more applications to serve as an input or I/O device. User input devices such as the smartphone 816, the smart wearables 818, the tablet 822, or the personal computer 824 may provide passive or active user input to the dynamic user control system. For example the occupancy of a space may be determined by the detected presence of such a user input device. Any of the above could have wireless connectivity and communicate as depicted in FIG. 9. In some embodiments the wireless connectivity may be provided by a wireless mesh network using a protocol such as Zigbee or Thread. Also, voice control 820 could be used, for example with a user speaking to one of the user input or I/O devices 808 that has a microphone and speech recognition capabilities. In some embodiments, the wall switch or wall controller is capable of receiving an audio command, such as voice commands form a user either direct or through an intelligent personal assistant or intelligent home control device, and distribute instructions based on the received audio command to another controllers or an electrochromic device. Light sensors, temperature sensors, motion sensor, occupancy sensor, intelligent personal assistants, any other intelligent home control device, including an Internet of things (IOT) device or intelligent lighting systems, etc., may be integrated with the embodiments and included as an I/O device 808. The I/O devices 808 can include sensors on laptops or other portable/mobile computing devices. In some embodiments, the window may be controlled by touching the window itself for input. FIGS. 8B and 8C illustrate an example slider controller 810 that can communicate with the wall controller in accordance with some embodiments. Slider controller 810 may communicate with the electrical drivers for one or a portion of the electrochromic doors or windows in the system. FIGS. 8B and 8C are not meant to be limiting as any of the user input devices 808 or I/O devices may communicate directly with the electrical drivers using either wireless or wired connections. In some embodiments the user input devices 808 or I/O devices may communicate with the electrical drivers over a local area network or a local mesh network. In other embodiments the user input devices 808 or I/O devices may communicate with the electrical driver though the internet or a cloud, where the routing of the communications through the cloud is performed by a network gateway device local to the dynamic user control system and the smart windows as will be described below in reference to FIG. 9.

FIG. 9 depicts an embodiment of an overall control system for smart devices, such as smart windows 802, which receives user input from, and communicates with, a dynamic user input control system. Input or I/O devices 808 are represented in the diagram as having wireless connectivity through an antenna 904. Multiple controllers 914 are shown in various devices and FIG. 9, and could singly or in cooperation control smart devices, in a distributed control system or a hierarchical control system, or a hybrid combination of these. Here, the smart devices are smart windows 802, each of which has an antenna 904 and a controller 914, although some embodiments omit the controller 914. These smart windows may incorporate electrochromic devices. The wall controller 102 could be any of the embodiments described herein, and could have a controller 914 and an antenna 904. In some embodiments, a controller 914 in a smart window driver 912 directs voltage and current levels for the smart windows to change transmissivity of the electrochromic window 804 (see FIG. 8A), and in other embodiments, these functions are controlled by a controller 914 integrated in or external to the smart window 802. Further information on the smart window driver may be found in application Ser. No. 14/994,091, which is incorporated by reference for all purposes. A network gateway device 902, also with a controller 914 and an antenna 904, communicates with any of the above-described devices, and serves as a gateway to a network 906, such as the global communication network known as the Internet, or an intranet or a cloud network. As part of the network 906, smart window services 908 (which could be implemented using one or more servers) includes a controller 914, scheduling 916, device statistics 918, site data 920, an application programming interface (API) 922, a building management application programming interface 924 and/or other cloud services for the smart windows 802 or other smart devices, in various embodiments. External cloud services 910 are also connected to the network 906, and could provide information for use by the various controllers 914 in controlling the smart devices, such as the smart windows 802 in this embodiment. In some embodiments controller 914 may be embodied as a slider controller 810 as mentioned herein and can control a window/door or a group of windows/doors. Controllers 914 may communicate through a mesh network (utilizing a protocol such as Zigbee or Thread) and take over control of the smart windows or doors in the case of loss of communication with the gateway 902 or loss of connectivity between the gateway 902 and network 906. In some embodiments, a mesh network that is Internet protocol (IP) based enables a border router in the gateway to allow access and/or control of the smart window or door drivers or controllers to any IP based device on the mesh network. Further embodiments with various combinations of wireless and wired connections are readily devised as variations.

As one example, a specified smart window or door 802, a group of smart windows or doors 802, or all of the smart windows and doors 802 in a specified installation could respond to whichever of the input or I/O devices 808, the wall controller 102, the network gateway device 902, or the smart window services 908 is actively directing transmissivity control of one or more smart windows 802 at a given moment. In hierarchical systems, various levels of control within the system could have specified priorities, and override other levels. A heuristic embodiment could learn from conditions and user inputs, and develop control schemes, user preferences, etc. Hierarchical organization and priorities could be changed over time as a result of system learning, or established by a user, or a combination of these.

As another example, each room or group of smart windows 802 could be associated to a user input or I/O device 808, or a wall controller 102, or wall switch, for that room, group or a user, and that device could act comparably to a light switch. Another controller 914, such as one in the network gateway device 902, or perhaps the wall controller 102 for groups of smart windows 802, could handle overall control of the smart windows 802. In a large commercial building, a building management system (BMS) could have priority over other user inputs to maintain optimal energy profile for the building. Priority for input or I/O devices 808 or the wall controller 102 could be based on which input device a specified user uses most frequently, and this information could be collected in the smart window services 908 in the network 906 and analyzed to establish and adjust over time.

Further embodiments of the wall controller and/or the control system for smart devices are envisioned for automotive use. For example, the wall controller could be mounted to a wall of an automotive door or dashboard panel, a wall of a roof liner, a wall of an automotive compartment, etc. The control system could interact with smart devices for control of smart electrochromic windows in the automobile, or other smart devices. The term "wall", relative to embodiments of the wall controller and mounting thereof may be interpreted broadly as pertaining to various structures of buildings and vehicles including compartments, partitions, loadbearing and non-loadbearing walls, ceilings, floors, separators, dividers, panels, doors, and other structures to which a controller could be mounted, etc.

Figure 10A:
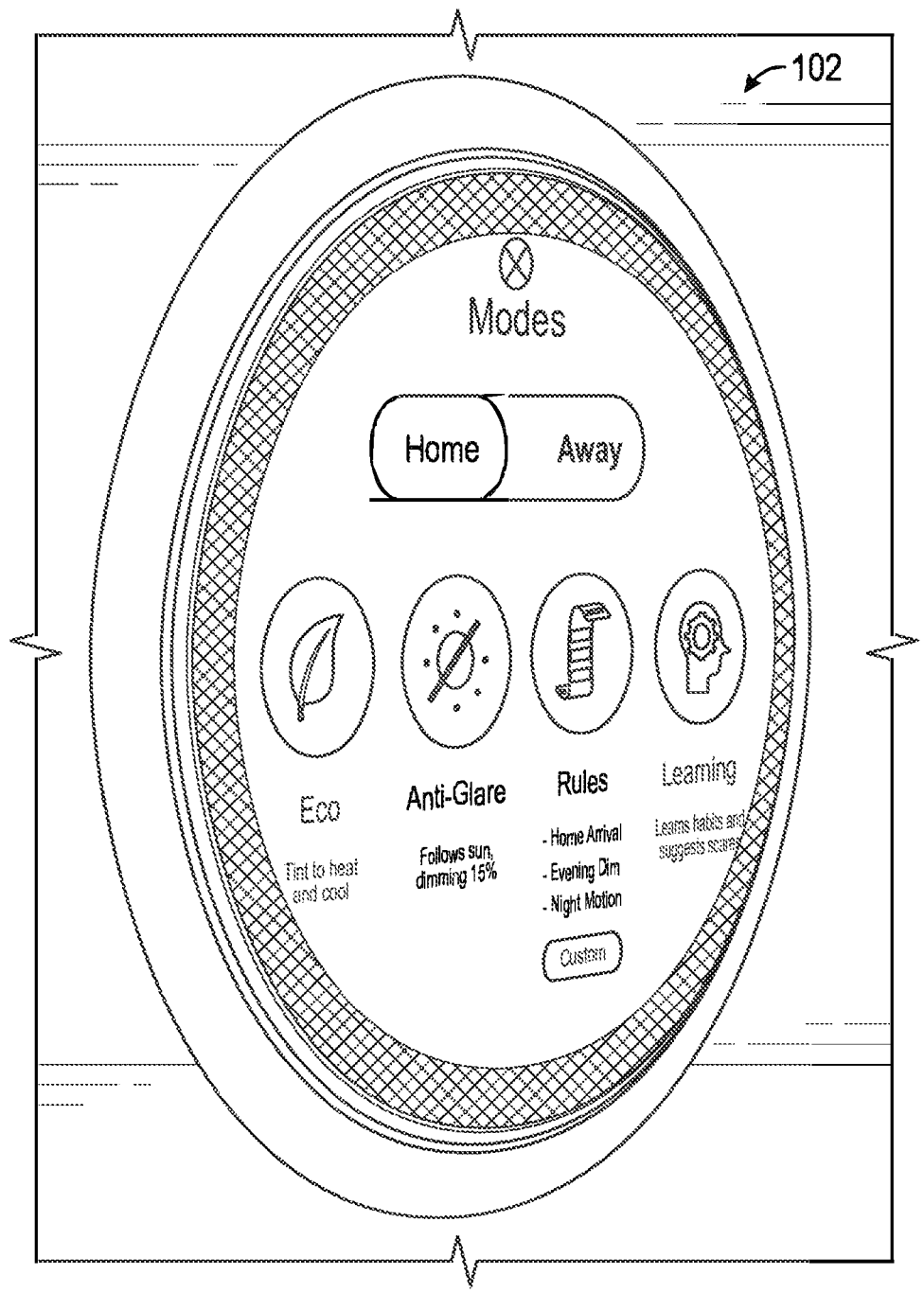
FIGS. 10A-10C illustrate control options for a window or door or group of windows and/or doors in accordance with some embodiments.
Figure 10B:
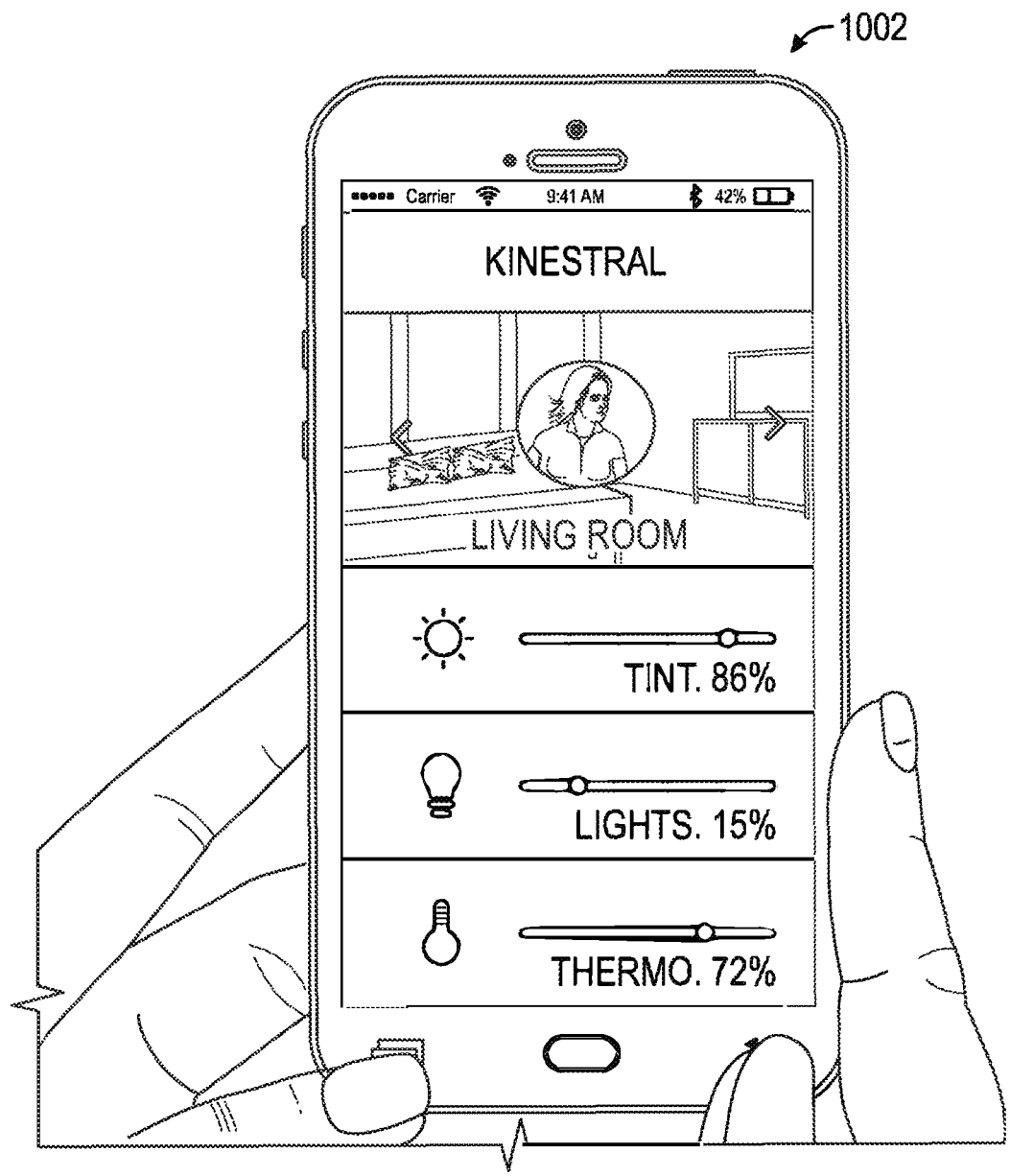
Figure 10C:
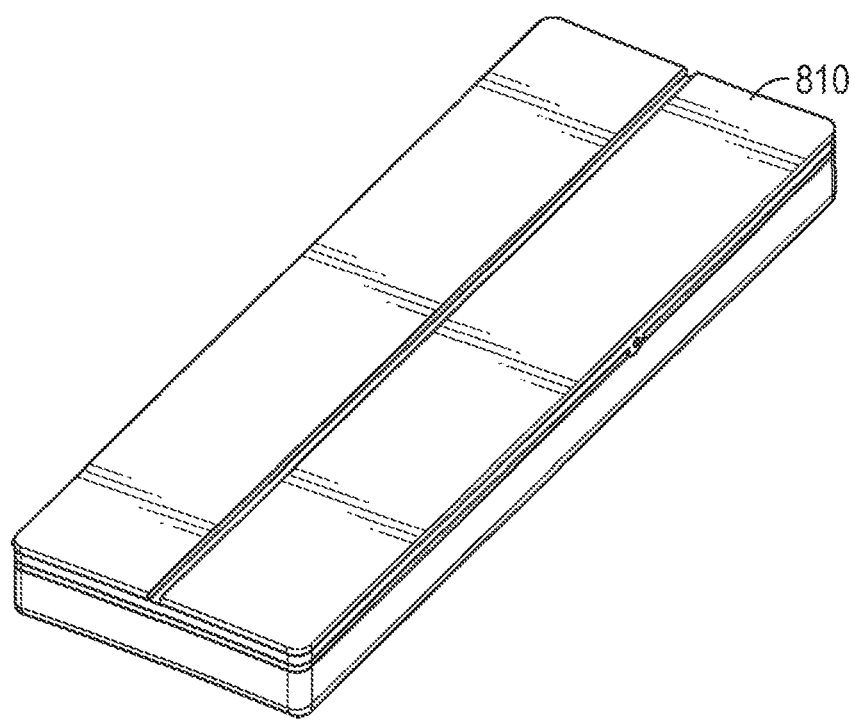

FIGS. 10A-10C illustrate various control options for the smart devices such as electrochromic windows and or doors in accordance with some embodiments. In FIG. 10A the wall controller 102 is illustrated as described herein. Wall controller 102 may control the smart windows and doors for an entire home or business or a portion or groups of windows and doors. In FIG. 10B a mobile computing device 1002 is utilized to interface with individual smart windows or groups of smart windows through an application or "app" executed on the mobile device. As discussed below in FIGS. 13A-E, the application may be utilized to create and edit scenes or change settings. FIG. 10C illustrates a controller 810 which in this embodiment is illustrated as a slider wall switch that may be utilized to control a smart window or door or a group of smart windows or doors. The controller 810 may be any of the user input devices described herein. Controller 810 may be able to communicate with other controllers 810 that control other windows and doors or a group of other windows and doors. The communication may be achieved through a mesh network which may utilize a protocol such as Zigbee or Thread, an Internet protocol based network communication, or any other suitable wireless network. In some embodiments, the communication between the various nodes through slider controller 810, also referred to as a wall switch, in a peer to peer type configuration will enable continuity of service where the gateway is down and communication may be lost through the cloud interface. In some embodiment, the controllers on the peer to peer network can execute the last known schedule delivered through the gateway prior to loss of communication or connectivity with the cloud. The communication through the mesh network in a peer to peer network may override control of the smart windows and doors in some embodiments.

Figure 11:
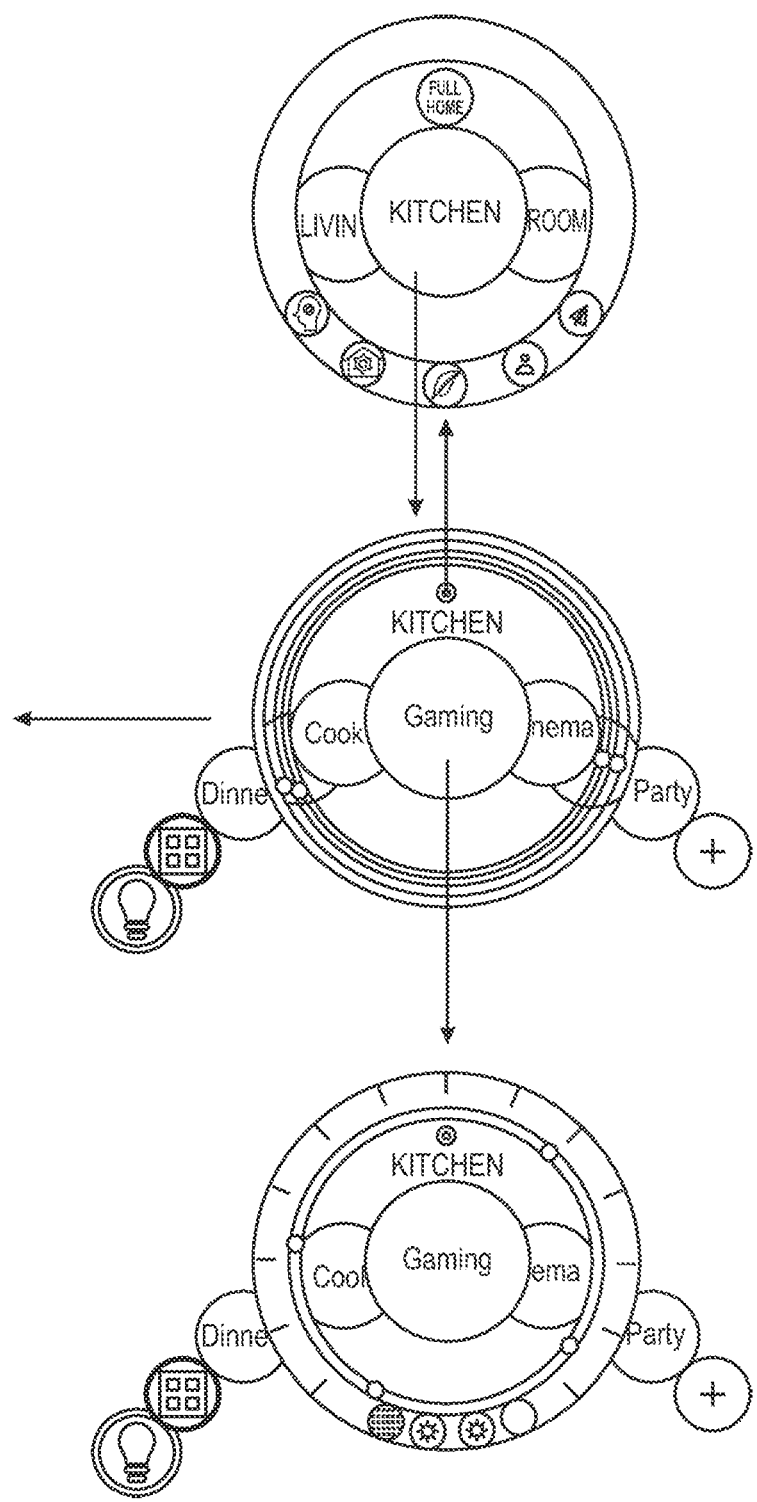
FIG. 11 illustrates various views of the wall controller interface in accordance with some embodiments.
Figure 12B:
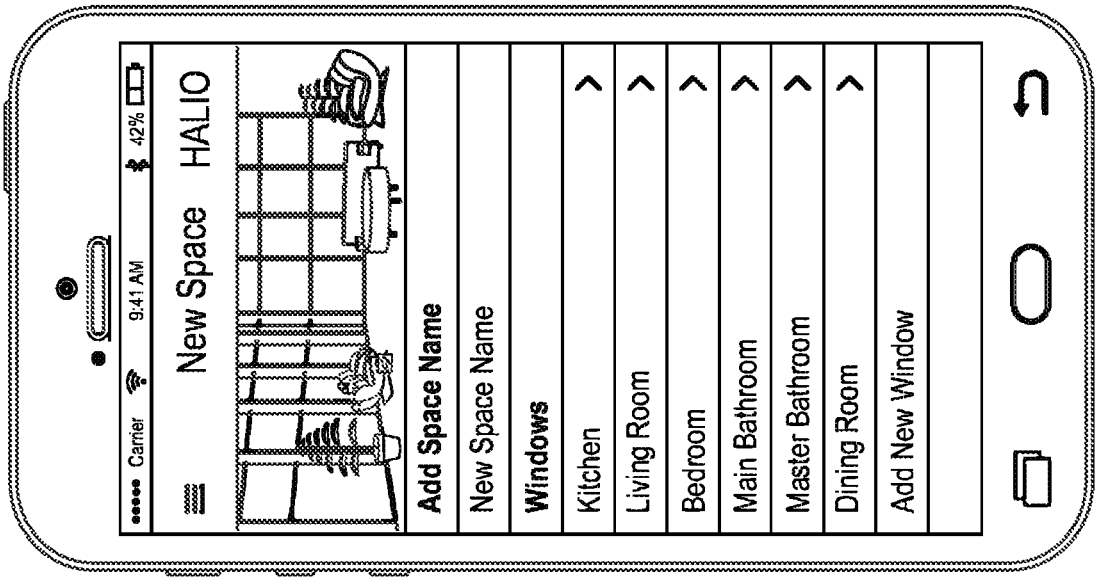
FIGS. 12A-12E illustrate various screens on a user interface in accordance with some embodiments.
Figure 12A:
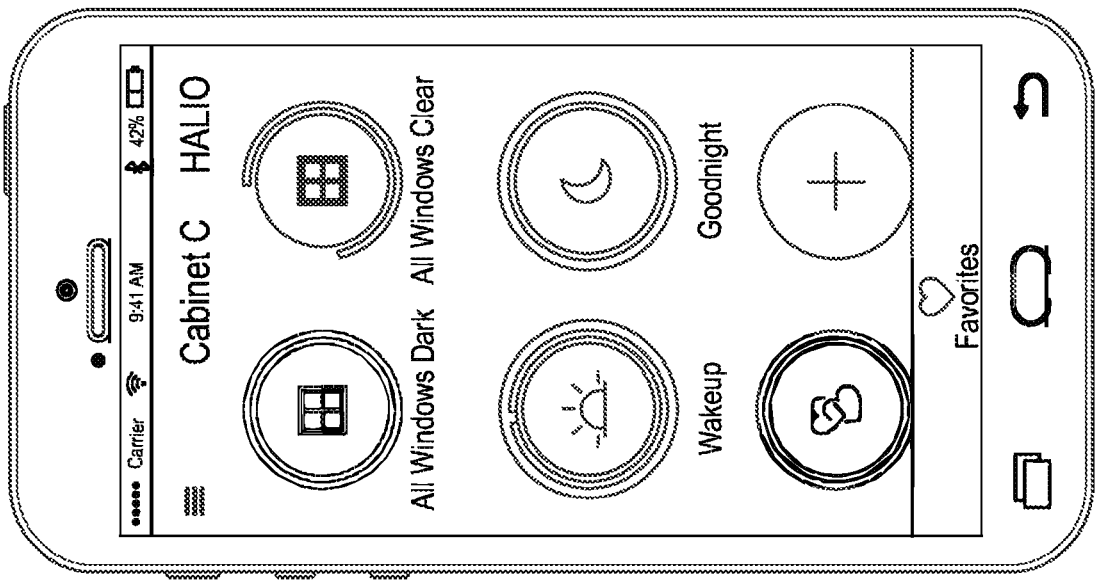
Figure 12D:
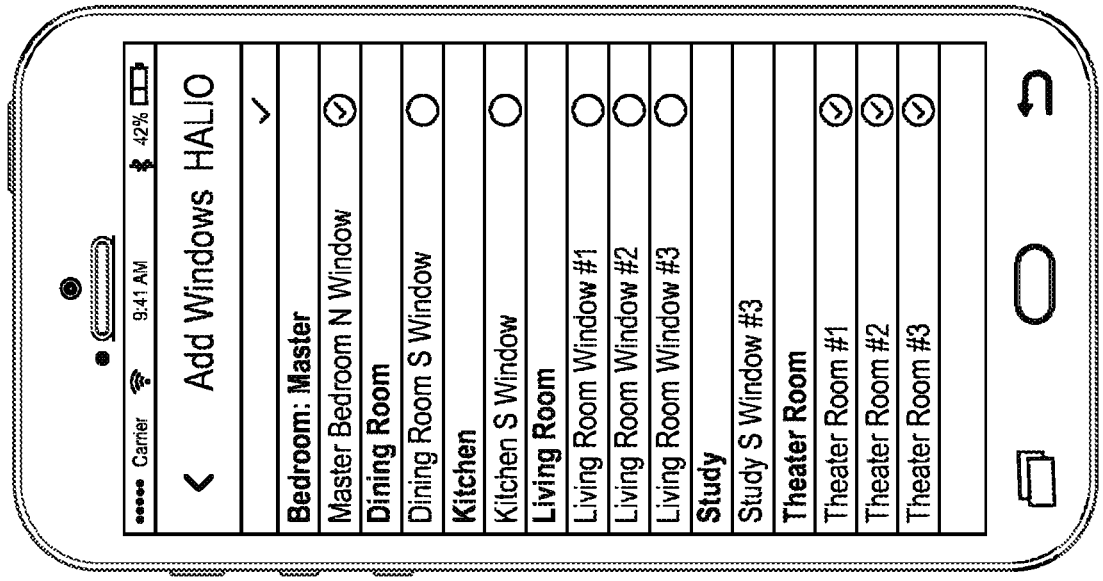
Figure 12C:
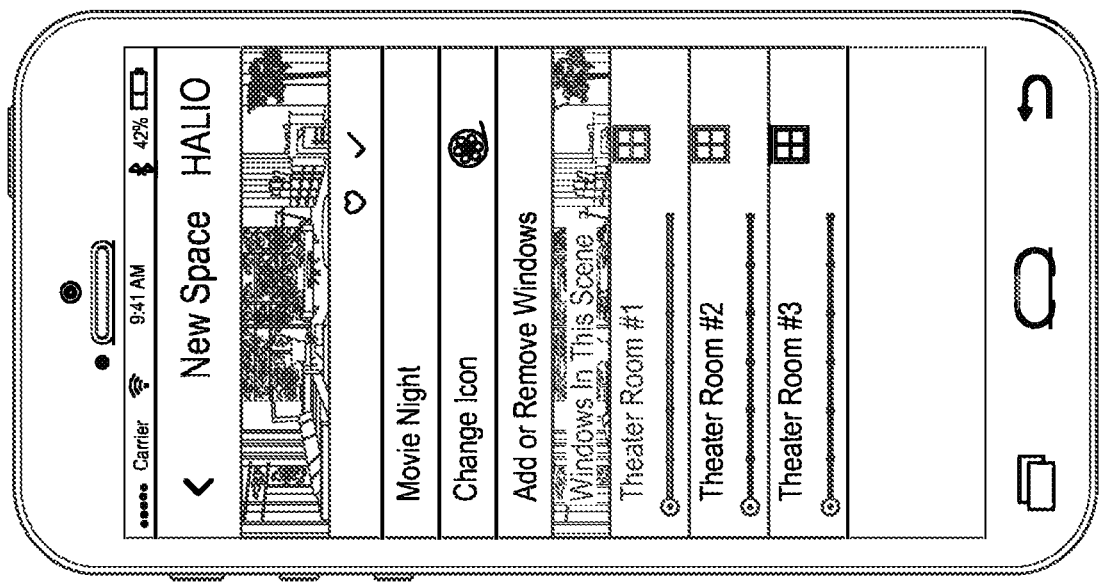
Figure 12E:
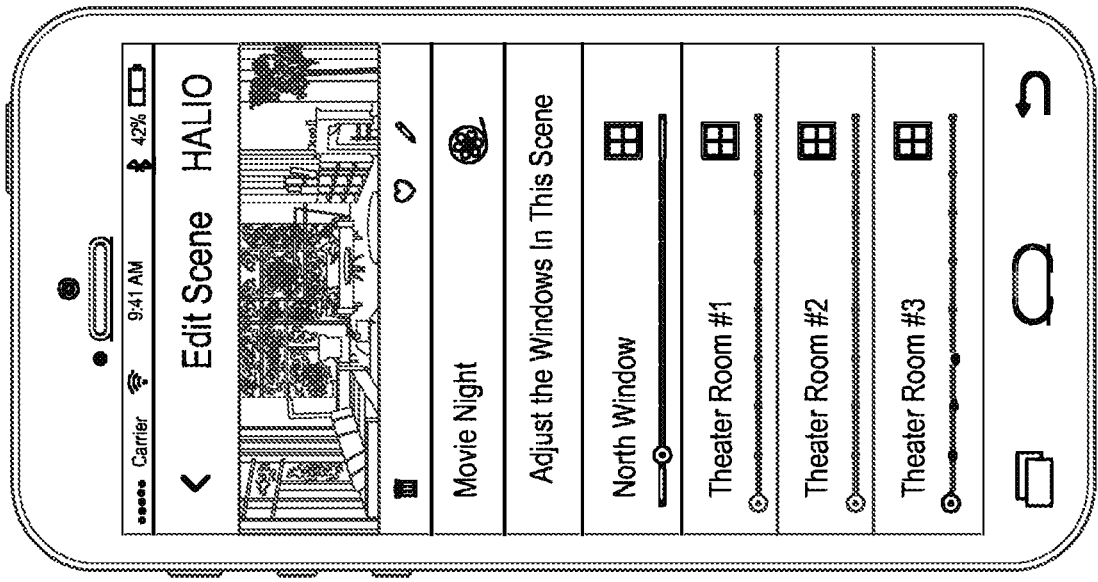

FIG. 11 is a user interface flow diagram in accordance with some embodiments. In the illustrated flow a user may click on a room or full home and then select a scene for the room or home to be applied to that room or the full home. In the example flow the user has selected to control the electrochromic windows according to a scene for the kitchen. Examples for setting up a scene and editing or adding scenes or windows are illustrated in FIGS. 12A-12E. In FIG. 12A a user interface for a home page on a controller or slider controller unit is provided. FIG. 12B illustrates a user interface for adding a new space while FIG. 12C illustrates a user interface for creating a new scene. FIG. 12D illustrates a user interface for selecting windows in a scene, while FIG. 12E illustrates a user interface for editing a scene. It should be appreciated that each interface can be arranged as a hierarchy of drop down or related pages and numerous variations are readily devised.

Figure 13:
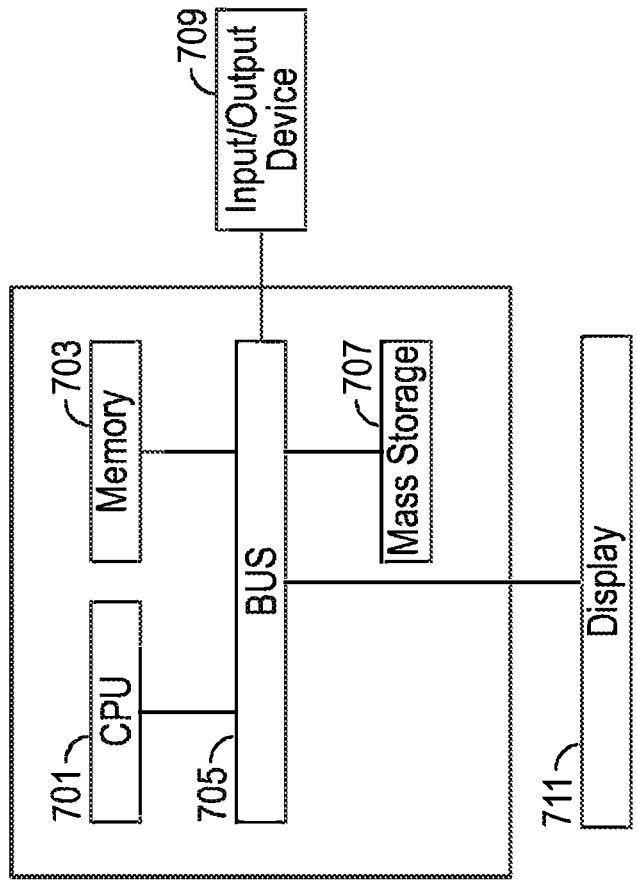
FIG. 13 is an illustration showing an exemplary computing device which may implement the embodiments described herein.

It should be appreciated that the methods described herein may be performed with a digital processing system, such as a conventional, general-purpose computer system. Special purpose computers, which are designed or programmed to perform only one function may be used in the alternative. FIG. 13 is an illustration showing an exemplary computing device which may implement the embodiments described herein. For example, in one embodiment the computing device of FIG. 13 may be used to perform embodiments of the functionality for detecting input from the rotatable rear projection touchscreen and generating control signals for devices controlled by the wall controller and/or data and images for projection in embodiments of the wall controller in accordance with some embodiments. The computing device includes a central processing unit (CPU) 701, which is coupled through a bus 705 to a memory 703, and mass storage device 707. Mass storage device 707 represents a persistent data storage device such as a floppy disc drive or a fixed disc drive, which may be local or remote in some embodiments. The mass storage device 707 could implement a backup storage, in some embodiments. Memory 703 may include read only memory, random access memory, etc. Applications resident on the computing device may be stored on or accessed via a computer readable medium such as memory 703 or mass storage device 707 in some embodiments. Applications may also be in the form of modulated electronic signals modulated accessed via a network modem or other network interface of the computing device. It should be appreciated that CPU 701 may be embodied in a general-purpose processor, a special purpose processor, or a specially programmed logic device in some embodiments.

Display 711 is in communication with CPU 701, memory 703, and mass storage device 707, through bus 705. Display 711 is configured to display any visualization tools or reports associated with the system described herein. Input/output device 709 is coupled to bus 705 in order to communicate information in command selections to CPU 701. It should be appreciated that data to and from external devices may be communicated through the input/output device 709. CPU 701 can be defined to execute the functionality described herein to enable the functionality described with reference to FIGS. 1-12. The code embodying this functionality may be stored within memory 703 or mass storage device 707 for execution by a processor such as CPU 701 in some embodiments. The operating system on the computing device may be iOS™, MS-WINDOWS™, OS/2™, LINUX™, or other known operating systems. It should be appreciated that the embodiments described herein may also be integrated with a virtualized computing system implemented with physical computing resources.

Detailed illustrative embodiments are disclosed herein. However, specific functional details disclosed herein are merely representative for purposes of describing embodiments. Embodiments may, however, be embodied in many alternate forms and should not be construed as limited to only the embodiments set forth herein.

It should be understood that although the terms first, second, etc. may be used herein to describe various steps or calculations, these steps or calculations should not be limited by these terms. These terms are only used to distinguish one step or calculation from another. For example, a first calculation could be termed a second calculation, and, similarly, a second step could be termed a first step, without departing from the scope of this disclosure. As used herein, the term "and/or" and the "/" symbol includes any and all combinations of one or more of the associated listed items.

As used herein, the singular forms "a", "an" and "the" are intended to include the plural forms as well, unless the context clearly indicates otherwise. It will be further understood that the terms "comprises", "comprising", "includes", and/or "including", when used herein, specify the presence of stated features, integers, steps, operations, elements, and/or components, but do not preclude the presence or addition of one or more other features, integers, steps, operations, elements, components, and/or groups thereof. Therefore, the terminology used herein is for the purpose of describing particular embodiments only and is not intended to be limiting.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

With the above embodiments in mind, it should be understood that the embodiments might employ various computer-implemented operations involving data stored in computer systems. These operations are those requiring physical manipulation of physical quantities. Usually, though not necessarily, these quantities take the form of electrical or magnetic signals capable of being stored, transferred, combined, compared, and otherwise manipulated. Further, the manipulations performed are often referred to in terms, such as producing, identifying, determining, or comparing. Any of the operations described herein that form part of the embodiments are useful machine operations. The embodiments also relate to a device or an apparatus for performing these operations. The apparatus can be specially constructed for the required purpose, or the apparatus can be a general-purpose computer selectively activated or configured by a computer program stored in the computer. In particular, various general-purpose machines can be used with computer programs written in accordance with the teachings herein, or it may be more convenient to construct a more specialized apparatus to perform the required operations.

A module, an application, a layer, an agent or other method-operable entity could be implemented as hardware, firmware, or a processor executing software, or combinations thereof. It should be appreciated that, where a software-based embodiment is disclosed herein, the software can be embodied in a physical machine such as a controller. For example, a controller could include a first module and a second module. A controller could be configured to perform various actions, e.g., of a method, an application, a layer or an agent.

The embodiments can also be embodied as computer readable code on a tangible non-transitory computer readable medium. The computer readable medium is any data storage device that can store data, which can be thereafter read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer system so that the computer readable code is stored and executed in a distributed fashion. Embodiments described herein may be practiced with various computer system configurations including hand-held devices, tablets, microprocessor systems, microprocessor-based or programmable consumer electronics, minicomputers, mainframe computers and the like. The embodiments can also be practiced in distributed computing environments where tasks are performed by remote processing devices that are linked through a wire-based or wireless network.

Although the method operations were described in a specific order, it should be understood that other operations may be performed in between described operations, described operations may be adjusted so that they occur at slightly different times or the described operations may be distributed in a system which allows the occurrence of the processing operations at various intervals associated with the processing.

In various embodiments, one or more portions of the methods and mechanisms described herein may form part of a cloud-computing environment. In such embodiments, resources may be provided over the Internet as services according to one or more various models. Such models may include Infrastructure as a Service (IaaS), Platform as a Service (PaaS), and Software as a Service (SaaS). In IaaS, computer infrastructure is delivered as a service. In such a case, the computing equipment is generally owned and operated by the service provider. In the PaaS model, software tools and underlying equipment used by developers to develop software solutions may be provided as a service and hosted by the service provider. SaaS typically includes a service provider licensing software as a service on demand.

The service provider may host the software, or may deploy the software to a customer for a given period of time. Numerous combinations of the above models are possible and are contemplated.

Various units, circuits, or other components may be described or claimed as "configured to" perform a task or tasks. In such contexts, the phrase "configured to" is used to connote structure by indicating that the units/circuits/components include structure (e.g., circuitry) that performs the task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. 112, sixth paragraph, for that unit/circuit/component. Additionally, "configured to" can include generic structure (e.g., generic circuitry) that is manipulated by software and/or firmware (e.g., an FPGA or a general-purpose processor executing software) to operate in manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks.

The foregoing description, for the purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the embodiments and its practical applications, to thereby enable others skilled in the art to best utilize the embodiments and various modifications as may be suited to the particular use contemplated. Accordingly, the present embodiments are to be considered as illustrative and not restrictive, and the invention is not to be limited to the details given herein, but may be modified within the scope and equivalents of the appended claims.

What is claimed is:

1. A wall controller, comprising:
   a projection screen;
   a projector arranged to project a digital image onto the projection screen from the projector; and
   a housing having the projection screen mounted thereto at a first end of the housing, the housing having the projector at a second end of the housing, the housing dimensioned to fit the second end of the housing through an aperture in a first wall, fit the second end into a wall space between the first wall and a second wall, and fit a majority of the first end of the housing into the aperture until the projection screen is parallel to a surface of the first wall and a front portion of the projection screen is flush with, recessed in or extends from the surface of the first wall.

2. The wall controller of claim 1 wherein the projection screen includes an input device.

3. The wall controller of claim 1 wherein the projection screen comprises:
   a rotatable front screen mounted to a touchscreen that is affixed to the first end of the housing so that the projected digital image appears on the projection screen.

4. The wall controller of claim 1, further comprising:
   a mirror mounted in an interior of the housing so as to reflect a beam from the projector onto the projection screen.

5. The wall controller of claim 1, further comprising:
   the projector mounted off-axis relative to the projection screen and configured to have a non-reflected beam aimed at the projection screen.

6. The wall controller of claim 1, wherein the projection screen includes a rotatable input device affixed to a rotatable cylindrical rim having an arc shaped reflective outer edge.

7. The wall controller of claim 1, wherein an overall length of the housing from the first end to the second end is greater than an overall depth of the housing, so as to accommodate a beam path from the projector to the projection screen.

8. The wall controller of claim 1, wherein the wall controller controls an electrochromic device.

9. The wall controller of claim 1, wherein the projection screen comprises:
   an input device with a reflective outer edge
   a touchscreen in fixed relation to the projector;
   a rotatable front screen in front of the touchscreen; and
   the reflective outer edge attached to the rotatable front screen at a boundary thereof and surrounding a boundary of the touchscreen.

10. A wall controller, comprising:
    a touchscreen with a rotatable front screen that overlaps the touchscreen;
    a projector arranged to project a digital image onto the touchscreen or the rotatable front screen, the projector mountable behind a wall having an aperture to which the wall controller is mountable; and
    the touchscreen configured to sense an object positioned at an edge of, and rotating, the rotatable front screen.

11. The wall controller of claim 10, wherein the touchscreen comprises:
    a first transparent or translucent disk of a first diameter and having a first cylindrical rim;
    a capacitive sensing film on a front surface of or inside the first transparent or translucent disk;
    a second transparent or translucent disk of a second diameter greater than the first diameter and having a second cylindrical rim; and
    the second cylindrical rim surrounding and coupled to the first cylindrical rim by a ring-shaped bearing, with the second transparent or translucent disk concentric to, rotatable relative to, and in front of the first transparent or translucent disk and the capacitive sensing film.

12. The wall controller of claim 10, wherein the front screen is translucent.

13. The wall controller of claim 10, wherein the digital image fills the touchscreen and the front screen and stays at a fixed orientation to the touchscreen as the front screen rotates.

14. The wall controller of claim 10, wherein the projector is configured to rotate the digital image to match rotation of the front screen.

15. A controller system for electrochromic devices, comprising:
    a plurality of controllers coupled through a mesh network, each of the plurality of controllers coupled to at least one electrochromic device for control of the at least one electrochromic device;
    the plurality of controllers configured to receive input from mobile computing devices and from a gateway coupled to an external network; and the plurality of controllers further configured to communicate between each other through the mesh network for control of the at least one electrochromic device without assistance from the gateway.

16. The system of claim 15, wherein the plurality of controllers execute a last known configuration for the at least one electrochromic device prior to the gateway losing connectivity with the external network.

17. The system of claim 15 wherein at least one of the plurality of controllers are configurable to receive an audio command and distribute instructions based on the received audio command to another one of the plurality of controllers or an electrochromic device.

18. The system of claim 15, wherein the electrochromic device is one of a door or a window.

19. The system of claim 15, wherein the mesh network is Internet Protocol based.

20. The system of claim 15, wherein the plurality of controller control tinting of the electrochromic device via application of a voltage to the electrochromic device.

* * * * *